United States Patent
Yamashita et al.

(10) Patent No.: US 7,787,231 B2
(45) Date of Patent: Aug. 31, 2010

(54) HIGH VOLTAGE GENERATING CIRCUIT, ION GENERATING DEVICE AND ELECTRICAL APPARATUS

(75) Inventors: Atsushi Yamashita, Kizugawa (JP); Takashi Horiyama, Nara (JP); Masakazu Ikeda, Kizugawa (JP)

(73) Assignee: Sharp Kabushiki Kaisha, Osaka (JP)

( * ) Notice: Subject to any disclaimer, the term of this patent is extended or adjusted under 35 U.S.C. 154(b) by 194 days.

(21) Appl. No.: 11/967,658

(22) Filed: Dec. 31, 2007

(65) Prior Publication Data

US 2008/0158768 A1 Jul. 3, 2008

(30) Foreign Application Priority Data

Jan. 30, 2007 (JP) ............................. 2007-018920
Mar. 30, 2007 (JP) ............................. 2007-090219

(51) Int. Cl.
*H01H 47/00* (2006.01)
(52) U.S. Cl. ........................ 361/230; 361/220
(58) Field of Classification Search ................. 361/213, 361/220, 231, 232
See application file for complete search history.

(56) References Cited

U.S. PATENT DOCUMENTS

| | | | | |
|---|---|---|---|---|
| 3,771,040 A | * | 11/1973 | Fletcher et al. | 363/21.13 |
| 4,138,233 A | * | 2/1979 | Masuda | 96/82 |
| 4,346,986 A | * | 8/1982 | Kuge et al. | 399/50 |
| 4,446,560 A | * | 5/1984 | Gabor | 373/25 |
| 6,184,631 B1 | | 2/2001 | Noma et al. | |
| 6,937,455 B2 | * | 8/2005 | Krichtafovitch et al. | 361/230 |
| 7,254,006 B2 | | 8/2007 | Sekoguchi et al. | |
| 7,371,354 B2 | * | 5/2008 | Lau | 422/186.04 |
| 2004/0007000 A1 | * | 1/2004 | Takeda et al. | 62/78 |

FOREIGN PATENT DOCUMENTS

| | | | |
|---|---|---|---|
| JP | 49-129493 A | 12/1974 |
| JP | 1-295665 A | 11/1989 |
| JP | 6-281683 A | 10/1994 |
| JP | 10-91258 A | 4/1998 |
| JP | 2000-295861 A | 10/2000 |
| JP | 2001-197749 A | 7/2001 |
| JP | 2002-43077 A | 2/2002 |
| JP | 2003-47651 A | 2/2003 |
| JP | 2003-144985 A | 5/2003 |
| JP | 2003-151796 A | 5/2003 |
| JP | 2005-38616 A | 2/2005 |
| JP | 2006-59711 A | 3/2006 |

\* cited by examiner

*Primary Examiner*—Danny Nguyen
(74) *Attorney, Agent, or Firm*—Birch, Stewart, Kolasch & Birch, LLP

(57) ABSTRACT

A high voltage generating circuit includes a boosting portion (e.g., a trigger coil (22)) for boosting DC voltage delivered from a DC power supply (26) so as to deliver high voltage at a secondary side, a switching element (e.g., a MOSFET (23)) for turning on and off current flowing in the primary side of the boosting portion, and a pulse signal generating portion (24B) for generating a pulse signal for controlling on and off of the switching element.

30 Claims, 29 Drawing Sheets

HIGH VOLTAGE GENERATING CIRCUIT, ION GENERATING DEVICE AND ELECTRICAL APPARATUS

This nonprovisional application claims priority under 35 U.S.C. §119(a) on Patent Application No. 2007-018920 filed in Japan on Jan. 30, 2007 and Patent Application No. 2007-090219 filed in Japan on Mar. 30, 2007, the entire contents of which are hereby incorporated by reference.

BACKGROUND OF THE INVENTION

1. Field of the Invention

The present invention relates to a high voltage generating circuit for generating high voltage, an ion generating device having the high voltage generating circuit for emitting ions into a space so that a room environment can be improved, and an electrical apparatus equipped with the ion generating device. Note that the above-mentioned electrical apparatus may include an air conditioner, a dehumidifier, a humidifier, an air cleaner, a refrigerator, a fan heater, a microwave oven, a washing machine with a dryer, a cleaner, a pasteurizer and the like, for example, used mainly in a closed space (indoor, a room in a building, a sickroom or an operating room in a hospital, a car interior, a cabin of a plane or a ship, a warehouse, a chamber of a refrigerator and the like).

2. Description of Related Art

Generally speaking, if a large number of people are in a closed room such as an office or a meeting room with little ventilation, air pollutant including carbon dioxide exhausted by breathing, tobacco smoke, dust and the like increases so that minus ions having an effect of relaxing people may decrease in the air. In particular, existence of tobacco smoke may decrease the minus ions to approximately ½ to ⅕ of a normal state. Therefore, various types of ion generating devices are on the market conventionally in order to supply minus ions in the air.

However, all the conventional ion generating devices are the DC high voltage type that generates only minus ions by a DC voltage. Therefore, such the ion generating devices cannot actively remove floating germs or the like in the air though they can supply minus ions in the air.

In view of the above-mentioned problem, the applicant has invented the ion generating device that generates $H^+(H_2O)_m$ as plus ions and $O_2^-(H_2O)_n$ as minus ions (m and n are natural numbers) in the air in substantially the same quantity, which are adhered to the floating germs or the like in the air so that the floating germ can be removed by decomposing action of active hydrogen peroxide ($H_2O_2$) and/or hydroxyl radical (•OH) generated on the occasion (see JP-A-2003-47651, for example).

Note that the above-mentioned invention is already brought into a practical use by the applicant. There are practical apparatuses including the ion generating device having a structure in which a discharging electrode is disposed outside a ceramic dielectric while an induction electrode is disposed inside the same, and the air cleaner, the air conditioner or the like equipped with the ion generating device.

FIG. 15 is a circuit diagram showing a conventional example of the ion generating device that can generate $H^+(H_2O)_m$ as plus ions and $O_2^-(H_2O)_n$ as minus ions (m and n are natural numbers) in substantially the same quantity. The conventional ion generating device shown in FIG. 15 has a high voltage generating circuit for generating AC impulse high voltage and a discharging portion X1 for generating ions by discharging the high voltage applied from the high voltage generating circuit. Furthermore, the above-mentioned high voltage generating circuit includes a resistor R1, a diode D1, a capacitor C1, a transformer T1 and a semiconductor switching element S1.

In the conventional ion generating device shown in FIG. 15, the output voltage of the commercial AC power source E1 is dropped by the resistor R1 and is rectified by the diode D1 as half-wave rectification, which is applied to the capacitor C1. When the capacitor C1 is charged until the terminal voltage E2 of the capacitor C1 shown in FIG. 16A increases to a predetermined threshold value $V_{TH}$ shown in FIG. 16A, the semiconductor switching element S1 is turned on so that the charged voltage of the capacitor C1 is discharged. This discharge causes current flowing in the primary winding L1 of the transformer T1 so that energy is transmitted to the secondary winding L2. As a result, the AC impulse high voltage E3 shown in FIG. 16B is applied to the discharging portion X1. Just after that, the semiconductor switching element S1 is turned off, so that charging of the capacitor C1 is restarted.

The changing and the discharging described above are repeated, and thus the AC impulse high voltage shown in FIG. 16B is applied to the discharging portion X1 repeatedly. On this occasion, corona discharge is generated in the vicinity of the discharging portion X1 so that the ambient air is ionized. As a result, plus ions of $H^+(H_2O)_m$ are generated when the positive voltage is applied while minus ions of $O_2^-(H_2O)_n$ are generated when the negative voltage is applied (m and n are natural numbers). Therefore, it is possible to make both ions be adhered to the floating germs or the like in the air so that the floating germ can be removed by decomposing action of active hydrogen peroxide ($H_2O_2$) or hydroxyl radical (•OH) composing action generated on the occasion.

It is sure that the conventional ion generating device shown in FIG. 15 can actively remove floating germs or the like in the air, so the room environment can be improved to be more comfortable.

However, the above-mentioned conventional ion generating device shown in FIG. 15 has a problem as follows. Since it uses the commercial AC power source E1 as an input power source, it needs the capacitor C11 with high withstand voltage and large capacitance and the semiconductor switching element S1 with high withstand voltage discharge for storing energy in the capacitor C1 temporarily and switching between charge and discharge of the capacitor C1 by the semiconductor switching element S1, which causes increase in the size.

In addition, the above-mentioned conventional ion generating device shown in FIG. 15 cannot adjust the voltage to be applied to the discharging portion X1 since the predetermined threshold value $V_{TH}$ of the semiconductor switching element S1 and a voltage transforming ratio of the transformer T1 determine the voltage to be applied to the discharging portion X1. Therefore, it has a problem that the discharging portion X1 may be broken down when voltage exceeding the withstand voltage of the discharging portion X1 is applied to the discharging portion X1.

In addition, the above-mentioned conventional ion generating device shown in FIG. 15 cannot adjust the voltage to be applied to the discharging portion X1, which is determined by the predetermined threshold value $V_{TH}$ of the semiconductor switching element S1 and the voltage transforming ratio of the transformer T1. Therefore, the same high voltage generating circuit thereof cannot support the case where the discharging portion X1 has a different material or shape so that the discharge start voltage of the discharging portion X1 is different.

In addition, the above-mentioned conventional ion generating device shown in FIG. 15 has the problem that the number of discharge times of the capacitor C1 per unit time, i.e., generating quantity of ions cannot be adjusted arbitrarily because the discharge energy is stored in the capacitor C1 temporarily.

In addition, the above-mentioned conventional ion generating device shown in FIG. 15 has a following problem. If the capacitance of the discharging portion X1 increases due to deterioration of the discharging portion X1 or adherence of foreign substances or the like, the output voltage from the high voltage generating circuit will be dropped (see FIG. 17). When the output voltage becomes below the discharge start voltage of the discharging portion X1, the discharge may stop, i.e., generation of ions may stop.

SUMMARY OF THE INVENTION

A first object of the present invention is to provide a high voltage generating circuit that can be downsized, an ion generating device equipped with the high voltage generating circuit, and an electrical apparatus equipped with the ion generating device.

In addition, a second object is to provide a high voltage generating circuit that can adjust an output high voltage value, an ion generating device equipped with the high voltage generating circuit so that a breakdown of the discharging portion can be prevented, and an electrical apparatus equipped with the ion generating device.

In addition, a third object is to provide a high voltage generating circuit that can adjust the output high voltage value, an ion generating device equipped with the high voltage generating circuit so that a change in specifications of the high voltage generating circuit in accordance with the discharge start voltage of the discharging portion is not necessary, and an electrical apparatus equipped with the ion generating device.

In addition, a fourth object is to provide a high voltage generating circuit that can adjust generating frequency of the output high voltage, an ion generating device equipped with the high voltage generating circuit so that the generating quantity of ions can be controlled freely, and an electrical apparatus equipped with the ion generating device.

In addition, a fifth object is to provide a high voltage generating circuit that can keep the output high voltage value, an ion generating device equipped with the high voltage generating circuit that can adjust the output to be maintained at a constant value even if a capacitance value of the discharging portion increases so that the output high voltage value from the high voltage generating circuit is decreased, and an electrical apparatus equipped with the ion generating device.

In order to achieve the above-mentioned first object, a high voltage generating circuit according to the present invention includes a boosting portion for boosting DC voltage delivered from a DC power supply, so as to deliver high voltage at a secondary side, a switching element for turning on and off primary current of the boosting portion, and a pulse signal generating portion for generating a pulse signal for controlling on and off of the switching element. According to this structure, the DC voltage delivered from the DC power supply is supplied without using the commercial AC power source as the input power source. Therefore, the switching element is not required to be a high withstand voltage component, and it is not necessary to provide a capacitor with high withstand voltage and large capacitance for storing discharge energy temporarily. For this reason, the high voltage generating circuit can be downsized. However, if the DC voltage delivered from the DC power supply is too large, it is necessary to increase the withstand voltage of the switching element. Therefore, it is desirable that the DC voltage delivered from the DC power supply should be lower than or equal to 24 volts.

Furthermore, in order to achieve the above-mentioned second and third objects as to the high voltage generating circuit having the structure described above, it is preferable to adopt the structure in which the pulse signal delivered from the pulse signal generating portion has a variable pulse width. According to this structure, the high voltage value delivered from the high voltage generating circuit can be adjusted. Therefore, if the present invention is applied to the ion generating device, a breakdown of the discharging portion can be prevented. In addition, it becomes unnecessary to change specifications of the high voltage generating circuit in accordance with the discharge start voltage of the discharging portion.

Furthermore, in order to achieve the above-mentioned fourth object as to each of the high voltage generating circuits having the structures described above, it is preferable to adopt the structure in which the pulse signal delivered from the pulse signal generating portion has a variable pulse interval. According to this structure, generating frequency of the high voltage delivered from the high voltage generating circuit can be adjusted. Therefore, if the present invention is applied to the ion generating device, the number of generating times per unit time of the high voltage applied to the discharging portion, i.e., the number of discharge times per unit time of the discharging portion can be adjusted, so that the generating quantity of ions can be adjusted.

Furthermore, in order to achieve the above-mentioned fifth object as to each of the high voltage generating circuits having the structures described above, it is preferable to adopt the structure including a feedback voltage generating portion for generating feedback voltage that is DC voltage corresponding to a peak value of the high voltage delivered from the secondary side of the boosting portion, and a voltage comparing portion for comparing the feedback voltage with a reference voltage, in which the high voltage delivered from the secondary side of the boosting portion is kept to be a constant value based on a result of the comparison performed by the voltage comparing portion. According to this structure, it is possible to adjust so that the output is maintained to be a constant value even if the value of the high voltage delivered from the high voltage generating circuit is dropped. Therefore, if the present invention is applied to the ion generating device, it is possible to adjust so that the output is maintained to be a constant value even if capacitance of the discharging portion increases so that the high voltage value delivered from the high voltage generating circuit is dropped.

Furthermore, in order to achieve the above-mentioned fifth object as to each of the high voltage generating circuits having the structures described above, it is preferable to adopt the structure including a feedback voltage generating portion for generating feedback voltage that is DC voltage corresponding to a peak value of node voltage of a primary side of the boosting portion and the switching element, and a voltage comparing portion for comparing the feedback voltage with a reference voltage, in which the high voltage delivered from the secondary side of the boosting portion is kept to be a constant value based on a result of the comparison performed by the voltage comparing portion. According to this structure, it is possible to adjust so that the output is maintained to be a constant value even if the value of the high voltage delivered from the high voltage generating circuit is dropped. Therefore, if the present invention is applied to the ion generating device, it is possible to adjust so that the output is maintained to be a constant value even if capacitance of the discharging portion increases so that the high voltage value delivered from the high voltage generating circuit is dropped. Note that it is possible in this structure that the secondary side of the boosting portion is floating.

In the high voltage generating circuit having the structure for achieving the above-mentioned fifth object, if the feedback voltage is always lower than the reference voltage during a predetermined period, it is preferable, for example, to increase a pulse width of the pulse signal delivered from the pulse signal generating portion so that the high voltage delivered from the secondary side of the boosting portion can be maintained to be a constant value. Alternatively, it is possible to increase a DC voltage delivered from the DC power supply so that the high voltage delivered from the secondary side of the boosting portion can be maintained to be a constant value.

In case of adopting the structure of increasing the DC voltage delivered from the DC power supply so that the high voltage delivered from the secondary side of the boosting portion can be maintained to be a constant value, it is preferable, for example, that the high voltage generating circuit includes a chopper type booster switching regulator, and that the output voltage of the booster switching regulator is the DC voltage delivered from the DC power supply. If the feedback voltage is always lower than the reference voltage during a predetermined period, it is preferable to increase the number of switching times of the booster switching regulator per a predetermined time so that the high voltage delivered from the secondary side of the boosting portion can be maintained to be a constant value.

Furthermore, in case of adopting the structure of increasing the pulse width of the pulse signal delivered from the pulse signal generating portion so that the high voltage delivered from the secondary side of the boosting portion can be maintained to be a constant value, it is possible to set an upper limit to the pulse width of the pulse signal delivered from the pulse signal generating portion, and to provide an error output portion that produces an error output when the pulse width of the pulse signal delivered from the pulse signal generating portion reaches the upper limit. Thus, if the present invention is applied to the ion generating device, a user can recognize that capacitance of the discharging portion has increased from the error output so that maintenance of the discharging portion can be performed.

Furthermore, in case of adopting the structure of increasing the number of switching times of the booster switching regulator per a predetermined time so that the high voltage delivered from the secondary side of the boosting portion can be maintained to be a constant value, it is possible to set an upper limit to the number of switching times of the booster switching regulator per a predetermined time, and to provide an error output portion that produces an error output when the number of switching times of the booster switching regulator per a predetermined time reaches the upper limit. Thus, if the present invention is applied to the ion generating device, a user can recognize that capacitance of the discharging portion has increased from the error output so that maintenance of the discharging portion can be performed.

It is possible to adopt a structure in which the voltage comparing portion operates when power is turned on or only at a constant interval of time. Thus, power consumption of the voltage comparing portion can be reduced.

In each of the high voltage circuits having the structures described above, a transformer or a trigger coil can be used as the boosting portion, for example. A MOSFET or a bipolar transistor can be used as the switching element. The pulse signal generating portion can be a microcomputer for controlling the generation of the pulse signal by software or a customer specific LSI for controlling the generation of the pulse signal by hardware.

Furthermore, in each of the high voltage circuits having the structures described above, it is desirable to adopt a structure in which the boosting portion delivers one AC impulse high voltage corresponding to one pulse of the pulse signal delivered from the pulse signal generating portion.

Furthermore, in each of the high voltage circuits having the structures described above, it is preferable to adopt a structure in which the high voltage value delivered from the secondary side of the boosting portion changes in accordance with a value of the DC voltage delivered from the DC power supply, so that the above-mentioned second and third objects can be achieved.

An ion generating device according to the present invention includes a high voltage generating circuit having any one of the structures described above, and a discharging portion to which the high voltage delivered from the high voltage generating circuit is applied, in which the discharging portion generates ions when the high voltage delivered from the high voltage generating circuit is applied to the discharging portion.

Furthermore, in order to achieve the above-mentioned second and third objects as to the ion generating device having the structure described above, it is preferable to adopt the structure in which a pulse width of the pulse signal delivered from the pulse signal generating portion provided in the high voltage generating circuit is adjusted so that the value of the high voltage delivered from the high voltage generating circuit can be adjusted.

Furthermore, in order to achieve the above-mentioned fourth object as to each of the ion generating devices having the structures described above, it is preferable to adopt the structure in which a pulse interval of the pulse signal delivered from the pulse signal generating portion provided in the high voltage generating circuit is adjusted so that generating quantity of ions can be controlled.

Furthermore, in each of the ion generating devices having the structures described above, it is preferable to adopt a structure in which a first rectifying portion (e.g., a diode) for rectifying the high voltage delivered from the secondary side of the boosting portion provided to the high voltage generating circuit into positive voltage, and a second rectifying portion (e.g., a diode) for rectifying the high voltage delivered from the secondary side of the boosting portion provided to the high voltage generating circuit into negative voltage are provided to the high voltage generating circuit, and the discharging portion has a first discharging portion to which the positive voltage from the first rectifying portion is applied and a second discharging portion to which the negative voltage from the second rectifying portion is applied. According to this structure, the first discharging portion to which the positive voltage is applied can generate plus ions and emit them in the air, while the second discharging portion to which the negative voltage is applied can generate minus ions and emit them in the air. In other words, both the plus and the minus ions are emitted separately. Therefore, the generated plus ions and minus ions are prevented from canceling each other and disappearing in the vicinity of the electrode of the discharging portion, so that the generated plus ions and minus ions can be emitted in the space effectively and with a balance.

Furthermore, in each of the ion generating devices having the structures described above, it is preferable that the discharging portion generates both the minus ions and the plus ions, and that the plus ions are $H^+(H_2O)_m$ while the minus ions are $O_2^-(H_2O)_n$ (m and n are natural numbers), so that the floating germs or the like can be removed.

An electrical apparatus according to the present invention includes the ion generating device having any one of the structures described above, and a delivery portion for delivering ions generated by the ion generating device in the air.

DETAILED DESCRIPTION OF THE PREFERRED EMBODIMENTS

Figure 1:
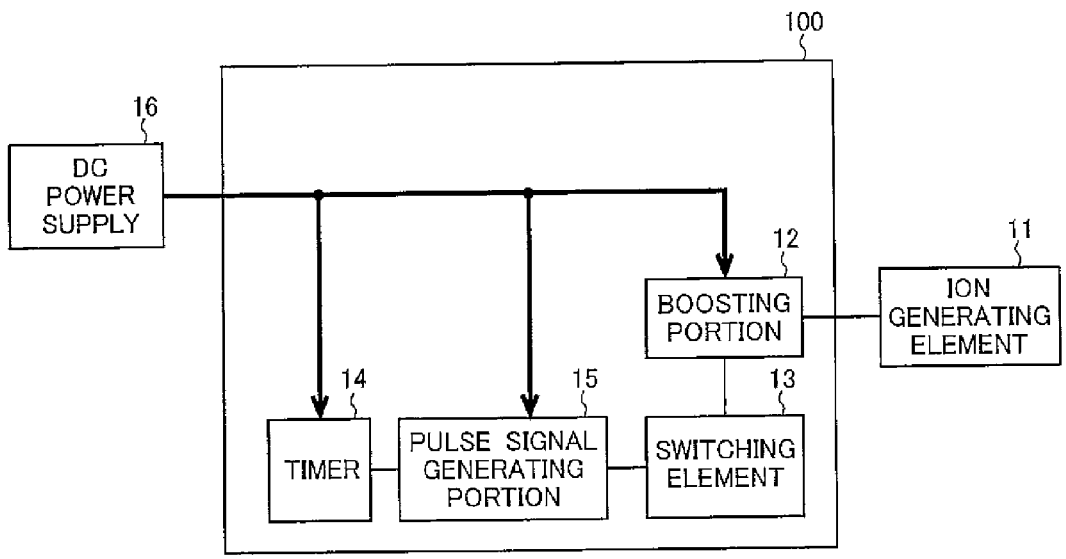
FIG. 1 is a functional block diagram showing a structural example of an ion generating device according to the present invention.

Hereinafter, embodiments of the present invention will be described with reference to the attached drawings. FIG. 1 is a functional block diagram showing a structural example of an ion generating device according to the present invention. The ion generating device shown in FIG. 1 includes an ion generating element 11 having a discharging portion and a high voltage generating circuit 100 for applying high voltage to the discharging portion. The high voltage generating circuit 100 includes a boosting portion 12 for boosting DC voltage supplied from a DC power supply 16 such as a battery so as to supply the high voltage to the discharging portion that is connected to a secondary side, a switching element 13 for turning on and off current flowing in a primary side of the boosting portion 12, a pulse signal generating portion 15 for generating a pulse signal for controlling on and off of the switching element 13, and a timer 14 for adjusting the pulse width and the pulse interval of the pulse signal. Furthermore, if it is not necessary to adjust the value of the high voltage delivered from the high voltage generating circuit 100 and to adjust generating frequency of the high voltage delivered from the high voltage generating circuit 100, it is preferable to eliminate the timer 14 so as to fix the waveform of the pulse signal generated by the pulse signal generating portion 15.

The ion generating device shown in FIG. 1 does not use the commercial AC power source as the input power source, and the DC voltage delivered from the DC power supply 16 is supplied to the high voltage generating circuit 100. Therefore, the switching element 13 is not required to be a high withstand voltage component, and it is not necessary to provide a capacitor with high withstand voltage and large capacitance for storing discharge energy temporarily. For this reason, the high voltage generating circuit 100 can be downsized. However, if the DC voltage delivered from the DC power supply 16 is too large, it is necessary to increase the withstand voltage of the switching element 13. Therefore, it is desirable that the DC voltage delivered from the DC power supply 16 should be lower than or equal to 24 volts.

Figure 2:
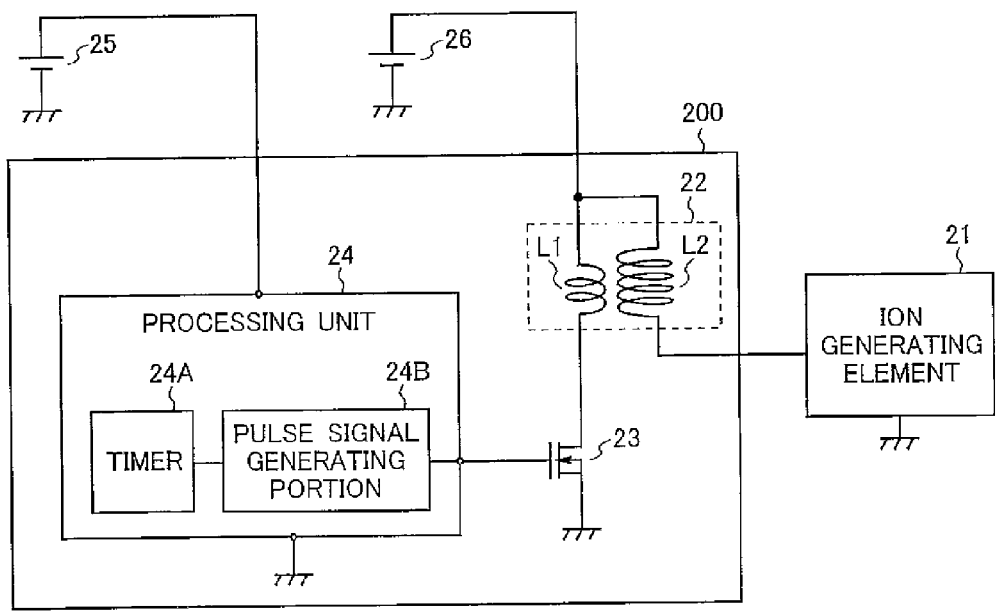
FIG. 2 is a circuit diagram showing an embodiment of the ion generating device shown in FIG. 1.

FIG. 2 is a circuit diagram showing an embodiment of the ion generating device shown in FIG. 1. The ion generating device shown in FIG. 2 includes an ion generating element 21 having a discharging portion and a high voltage generating circuit 200 for applying high voltage to the discharging portion. The high voltage generating circuit 200 includes a trigger coil 22 as a boosting portion for boosting the DC voltage supplied from a DC power supply 26 so as to deliver the high voltage to the discharging portion that is connected to the secondary side, a MOSFET 23 as a switching element for turning on and off current flowing in the primary side of the trigger coil 22, and a processing unit 24 having a pulse signal generating portion 24B for generating a pulse signal for controlling on and off of the MOSFET 23, a timer 24A for adjusting the pulse width and the pulse interval of the pulse signal. As an example of the processing unit 24, there is a microcomputer for controlling by software the generation of the pulse signal and the adjustment of the pulse width and the pulse interval of the pulse signal, or a customer specific LSI for controlling by hardware the generation of the pulse signal and the adjustment of the pulse width and the pulse interval of the pulse signal.

A positive electrode of a DC power supply 25 is connected to a power source terminal of the processing unit 24. A positive electrode of the DC power supply 26 is connected to an end of a primary winding L1 and an end of a secondary winding L2 of the trigger coil 22. A negative electrode of the DC power supply 25, a negative electrode of the DC power supply 26 and a GND terminal of the processing unit 24 are connected to the ground. The other end of the primary winding L1 of the trigger coil 22 is connected to a drain terminal of the MOSFET 23. A source terminal of the MOSFET 23 is connected to the ground. A gate terminal of the MOSFET 23 is connected to a pulse signal output terminal of the processing unit 24. The other end of the secondary winding of the trigger coil 22 is connected to a discharge electrode of the discharging portion of the ion generating element 21. An induction electrode of the discharging portion of the ion generating element 21 is connected to the ground.

Figure 3A:
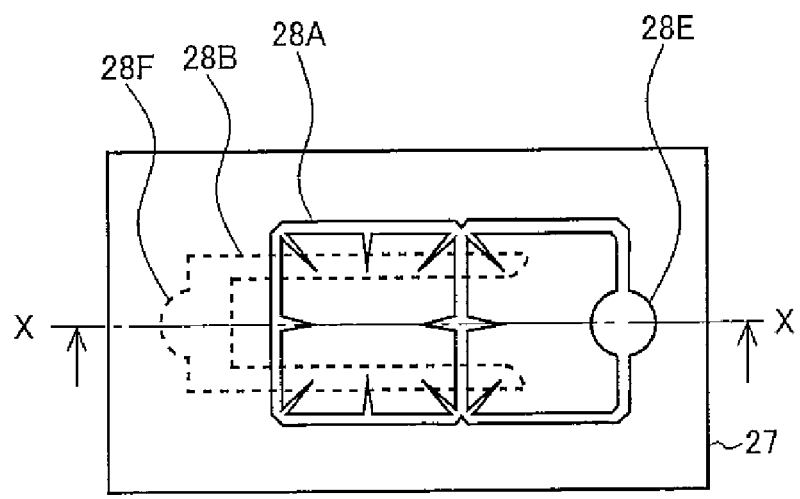
FIGS. 3A and 3B are diagrams showing a structural example of an ion generating element provided to the ion generating device shown in FIG. 2.
Figure 3B:
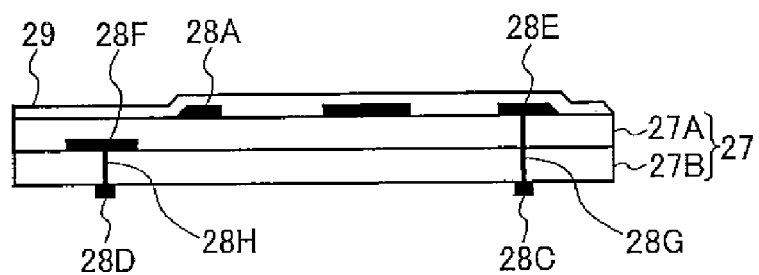

Here, a structural example of the ion generating element 21 is shown in FIGS. 3A and 3B. FIG. 3A is a top view of the ion generating element 21, and FIG. 3B is a cross sectional view of the ion generating element 21 cut along the line X-X.

The ion generating element shown in FIGS. 3A and 3B includes a dielectric 27 (an upper dielectric 27A and a lower dielectric 27B), a discharging portion (a discharge electrode 28A, an induction electrode 28B, a discharge electrode contact 28C, an induction electrode contact 28D, connecting terminals 28E and 28F, and connecting channels 28G and 28H), and a coating layer 29.

The dielectric 27 includes the upper dielectric 27A and the lower dielectric 27B having substantially rectangular solid shapes glued to each other. If an inorganic material is selected as a material of the dielectric 27, it is possible to use a ceramic such as high purity alumina, glass ceramics, forsterite, steatite or the like. Furthermore, if an organic material is selected as a material of the dielectric 27, it is preferable to use a resin such as polyimide, glass epoxy or the like that is superior in oxidation resistance. However, considering an aspect of corrosion resistance, it is desirable to select an inorganic material as a material of the dielectric 27. Further, considering formability and easiness of forming electrodes as described later, it is preferable to use a ceramic for forming the dielectric 27. In addition, since it is desirable that insulation resistance between the discharge electrode 28A and the induction electrode 28B be uniform, the material of the dielectric 27 should preferably have little variation of density and a uniform insulation factor. Furthermore, the shape of the dielectric 27 may be other than the substantially rectangular solid shape (e.g., a disk shape, an elliptical plate shape, a polygonal plate shape or the like) or a cylindrical shape. However, considering productivity, it is preferable to adopt a plate-like shape (including a disk shape and a rectangular solid shape) like this structural example.

The discharge electrode 28A is formed on the surface of the upper dielectric 27A integrally to the upper dielectric 27A. As a material of the discharge electrode 28A, any material having electrical conductivity such as tungsten, for example, can be used without limitation, under the condition that the material is not melted or deformed by electric discharge.

In addition, the induction electrode 28B is disposed in parallel with the discharge electrode 28A via the upper dielectric 27A. This arrangement enables a distance between the discharge electrode 28A and the induction electrode 28B (hereinafter referred to as an interelectrode distance) to be constant, so that insulation resistance between the discharge electrode and the induction electrode can be equalized. Thus, a state of discharge can be stabilized so that ions can be generated appropriately. Furthermore, if the dielectric 27 has a cylindrical shape, it is preferable to dispose the discharge electrode 28A on the outer surface of the cylinder and to dispose the induction electrode 28B like a shaft, so that the interelectrode distance can be constant. Although any material such as tungsten, for example, having electrical conductivity can be used without limitation as a material of the induction electrode 28B similarly to the discharge electrode 28A, under the condition that the material is not melted or deformed by electric discharge.

The discharge electrode contact 28C is connected electrically to the discharge electrode 28A via a connecting terminal 28E formed on the same surface as the discharge electrode 28A (i.e., on the surface of the upper dielectric 27A) and the connecting channel 28C. Therefore, the discharge electrode 28A can be connected electrically to the secondary winding L2 of the trigger coil 22 by connecting the discharge electrode contact 28C to an end of a lead wire (a copper wire, an aluminum wire or the like) and by connecting the other end of the lead wire to the other end of the secondary winding L2 of the trigger coil 22.

The induction electrode contact 28D is connected electrically to the induction electrode 28B via a connecting terminal 28F formed on the same surface as the induction electrode 28B (i.e., on the surface of the lower dielectric 27B) and the connecting channel 28H. Therefore, the induction electrode 28B can be set to the GND potential by connecting the induction electrode contact 28D to an end of a lead wire (a copper wire, an aluminum wire or the like) and by connecting the other end of the lead wire to the ground.

Furthermore, in the ion generating element shown in FIGS. 3A and 3B, the discharge electrode 28A has acute angle portions for concentrating electric field so that local discharge can be generated.

Next, with reference to FIG. 2 again, an operation of the ion generating device shown in FIG. 2 will be described. When the MOSFET 23 of the ion generating device shown in FIG. 2 is turned on temporarily by the pulse signal delivered from the processing unit 24, current flows in the primary winding L1 of the trigger coil 22. Then, the secondary winding L2 of the trigger coil 22 generates high voltage depending on a turns ratio by mutual induction, which is applied to the discharge electrode of the discharging portion of the ion generating element 21. After that, the MOSFET 23 becomes a turned-off state until the next pulse signal is delivered at a time interval controlled by the timer 24A of the processing unit 24, so the high voltage is not applied to the discharge electrode of the discharging portion of the ion generating element 21. The operation of generating the high voltage is repeated in accordance with the pulse signal delivered at a time interval controlled by the timer 24A of the processing unit 24.

Figure 4A:
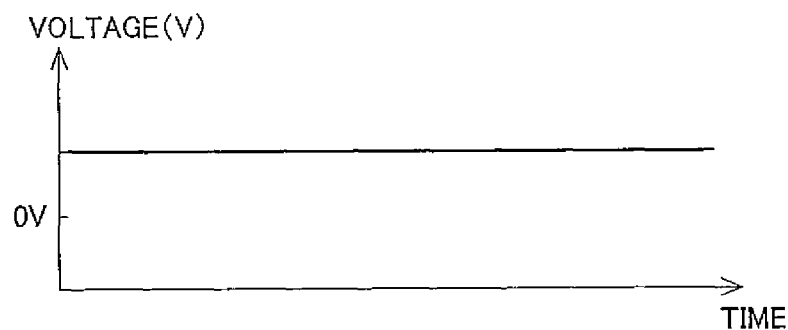
FIGS. 4A to 4C are diagrams showing voltage waveforms at individual portions of the ion generating device shown in FIG. 2.
Figure 4B:
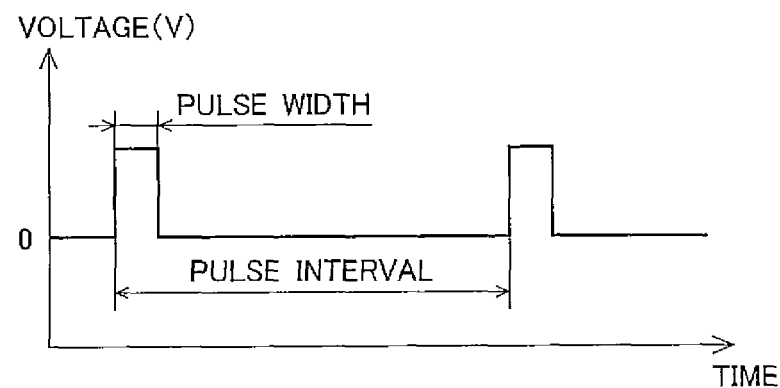
Figure 4C:
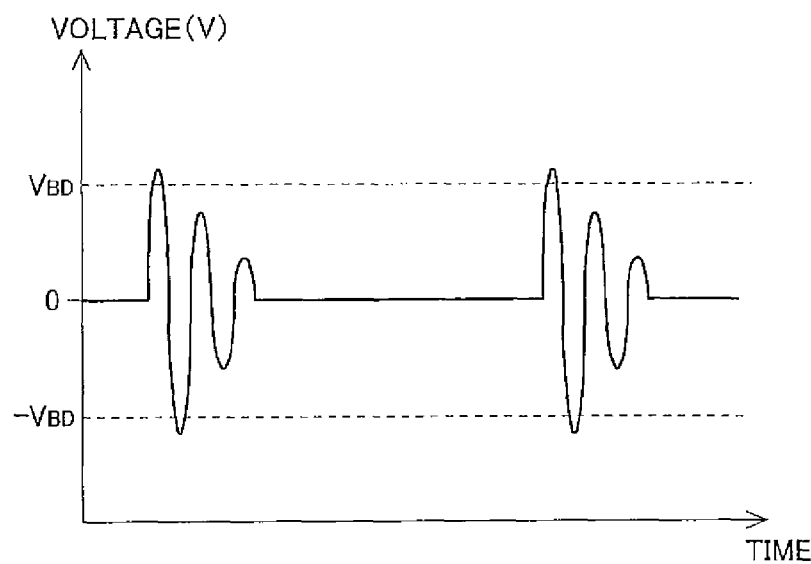

The voltages at the individual portions in the ion generating device shown in FIG. 2 have waveforms as shown in FIGS. 4A to 4C. Here, FIG. 4A shows a waveform of the voltage applied to the trigger coil 22 from the DC power supply 26, i.e., the input voltage of the trigger coil 22, FIG. 4B shows a waveform of the pulse signal delivered from the processing unit 24, i.e., the gate signal of the MOSFET 23, and FIG. 4C shows a waveform of the output voltage of the trigger coil 22.

The AC impulse high voltage shown in FIG. 4C is applied to the discharge electrode of the discharging portion of the ion generating element 21. On this occasion, if the voltage that is applied to discharge electrode of the discharging portion of the ion generating element 21 reaches discharge start voltage $\pm V_{BD}$ of the ion generating element 21 (see FIG. 4C), corona discharge is generated on the surface and the vicinity of the ion generating element 21 so that the surrounding air is ionized. Since plus ions of $H^+(H_2O)_m$ are generated when the positive voltage is applied while minus ions of $O_2^-(H_2O)_n$ are generated when the negative voltage is applied (m and n are natural numbers), substantially the same quantity of $H^+(H_2O)_m$ as plus ions and $O_2^-(H_2O)_n$ as minus ions (m and n are natural numbers) are generated.

In addition, as to the ion generating device shown in FIG. 2, a peak value of the high voltage generated at the secondary winding L2 of the trigger coil 22 can be adjusted arbitrarily by adjusting at least one of the pulse width of the pulse signal delivered from the processing unit 24 and the voltage applied to the trigger coil 22 from the DC power supply 26. Therefore, a breakdown of the discharging portion of the ion generating element 21 can be prevented. In addition, it becomes unnecessary to change specifications of the high voltage generating circuit in accordance with the discharge start voltage of the discharging portion of the ion generating element 21. Furthermore, the number of generating times per unit time of the AC impulse high voltage applied to the discharge electrode of the discharging portion of the ion generating element 21, i.e., the number of discharge times per unit time of the ion generating element 21 can be adjusted by adjusting the pulse interval of the pulse signal delivered from the processing unit 24.

Examples will be described, in which discharge is generated by the high voltage generating circuit 200 according to the present invention as for three types of ion generating elements including the ion generating element A that starts discharge at ±1.5 kilovolts, the ion generating element B that starts discharge at ±2.0 kilovolts, and the ion generating element C that starts discharge at ±3.0 kilovolts as shown in Table 1 in the ion generating device shown in FIG. 2.

TABLE 1

| Ion Generating Element | Discharge Start Voltage |
| --- | --- |
| A | ±1.5 kV |
| B | ±2.0 kV |
| C | ±3.0 kV |

Figure 5A:
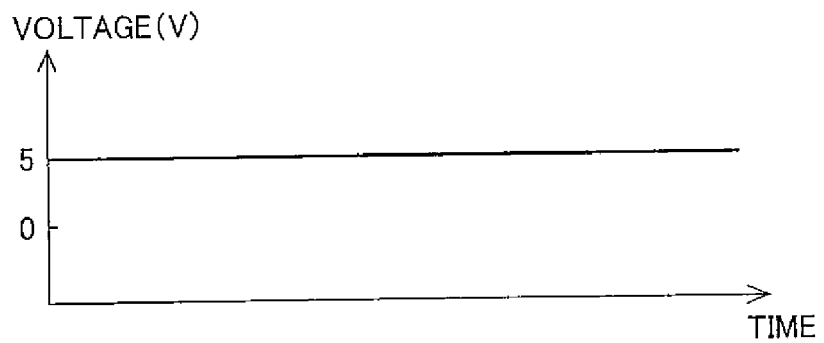
FIGS. 5A to 5C are diagrams showing voltage waveforms at individual portions of the ion generating device shown in FIG. 2.
Figure 5B:
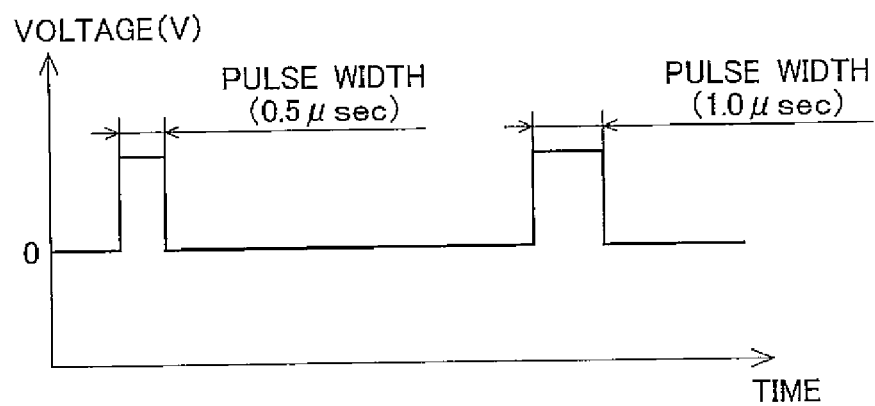
Figure 5C:
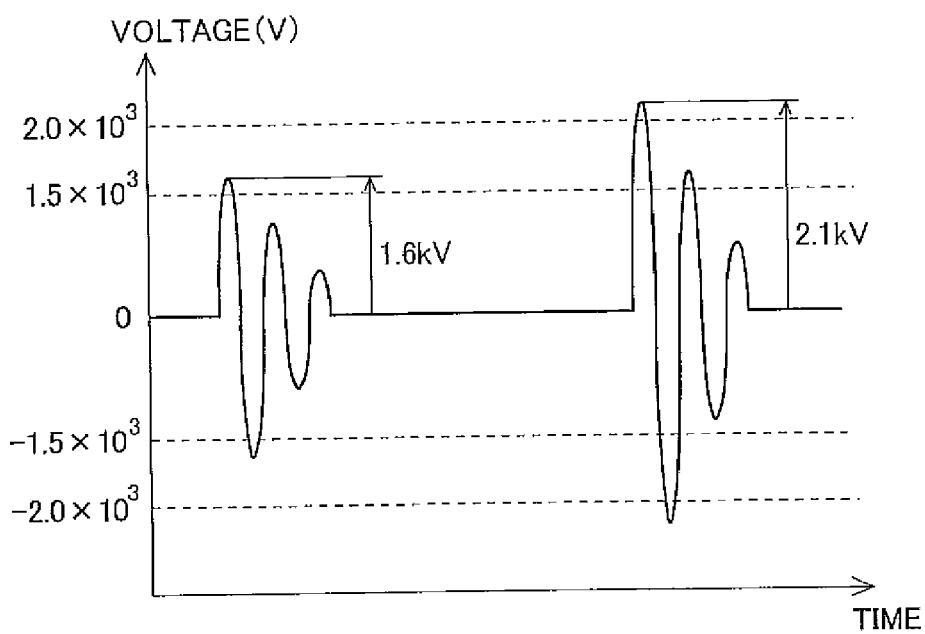

A first example will be described, which is for performing the discharge of the ion generating elements having different discharge start voltage values as shown in Table 1 (the ion generating element A and the ion generating element B). The voltage that is applied to the trigger coil 22 from DC power supply 26 (the input voltage of the trigger coil 22) is supposed to be 5 volts as shown in FIG. 5A, and the pulse width of the pulse signal that is delivered from the processing unit 24 is supposed to be 0.5 μsec like the first pulse shown in FIG. 5B. Then, the voltage that is generated at the secondary winding L2 of the trigger coil 22 (i.e., the output voltage of the trigger coil 22) becomes ±1.6 kilovolts as the peak value like the first AC impulse high voltage shown in FIG. 5C, so that the ion generating element A having the discharge start voltage of ±1.5 kilovolts can discharge. However, under this condition the ion generating element B having the discharge start voltage of ±2.0 kilovolts cannot discharge. Therefore, the voltage applied to the trigger coil 22 from the DC power supply 26 (i.e., the input voltage of the trigger coil 22) is maintained to be 5 volts as shown in FIG. 5A, while the pulse width of the pulse signal delivered from the processing unit 24 is increased to be 1.0 μsec like the second pulse shown in FIG. 5B. In this case, the voltage generated at the secondary winding L2 of the trigger coil 22 (the output voltage of the trigger coil 22) increases to ±2.1 kilovolts as the peak value like the second AC impulse high voltage shown in FIG. 5C, so that the ion generating element B having the discharge start voltage of ±2.0 kilovolts can discharge. A relationship between the pulse width of the pulse signal delivered from the processing unit 24 and the voltage generated at the secondary winding L2 of the trigger coil 22 (the output voltage of the trigger coil 22) in the first example is shown in Table 2.

TABLE 2

| IGE | DSV | Pulse Width | Input Voltage | Output Voltage |
| --- | --- | --- | --- | --- |
| A | ±1.5 kV | 0.5 μsec | 5 V | ±1.6 kV |
| B | ±2.0 kV | 1.0 μsec | 5 V | ±2.1 kV |

IGE: ion generating element
DSV: discharge start voltage

Note that the pulse width values of 0.5 μsec and 1.0 μsec are merely examples, and that the output voltage of the trigger coil 22 varies in accordance with the number of turns of the windings L1 and L2 of the trigger coil 22, and the turned-on time of the MOSFET 23 and the like. In other words, the voltage generated at the secondary winding L2 of the trigger coil 22 (the output voltage of the trigger coil 22) can be controlled arbitrarily by adjusting the pulse width in accordance with the components that are used.

Figure 6A:
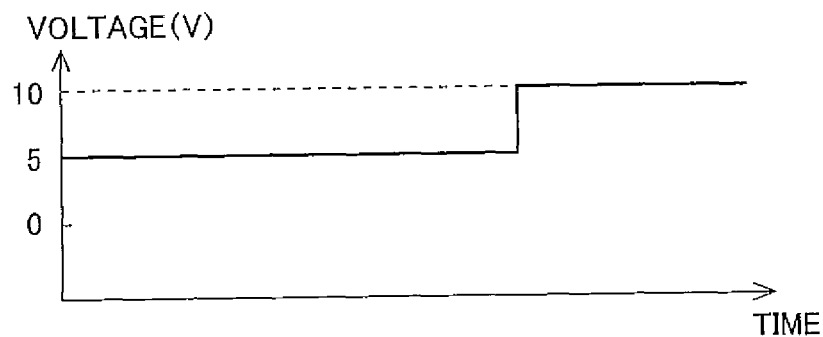
FIGS. 6A to 6C are diagrams showing voltage waveforms at individual portions of the ion generating device shown in FIG. 2.
Figure 6B:
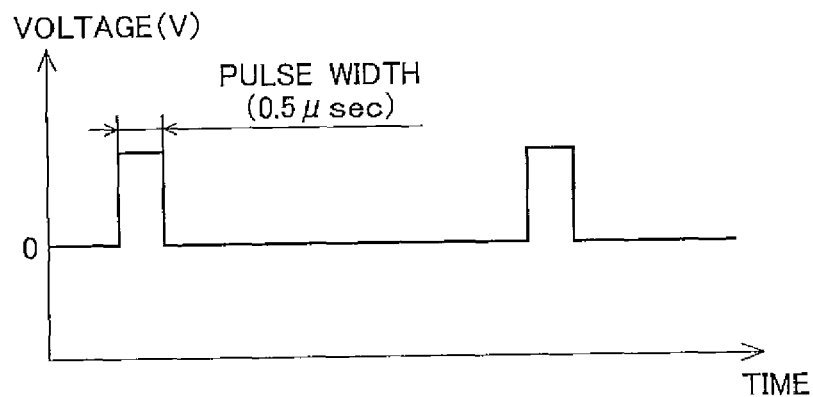
Figure 6C:
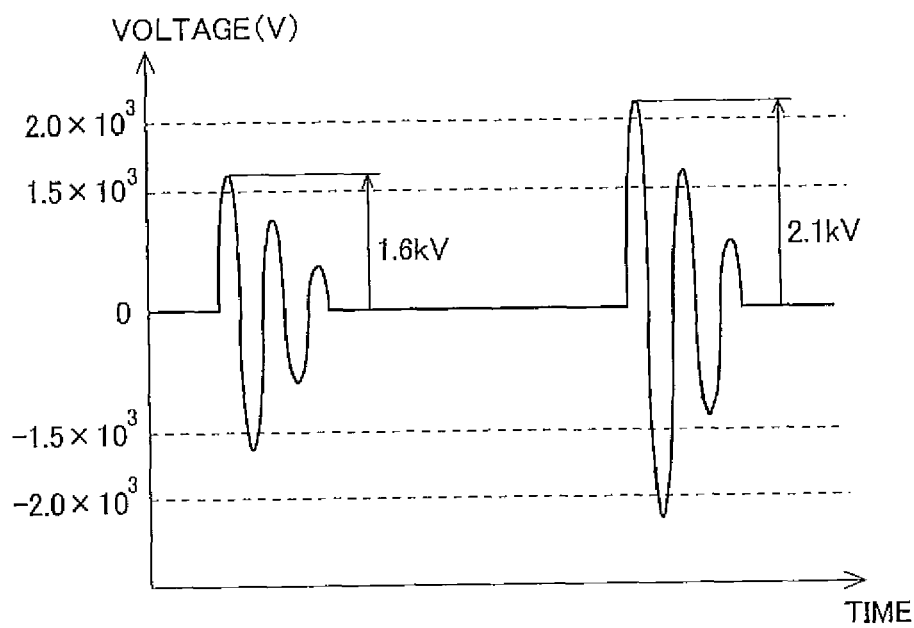

Next, a second example will be described, which is for performing the discharge of the ion generating elements having different discharge start voltage values as shown in Table 1 (the ion generating element A and the ion generating element B). The voltage that is applied to the trigger coil 22 from the DC power supply 26 (the input voltage of the trigger coil 22) is supposed to be 5 volts as shown in FIG. 6A, and the pulse width of the pulse signal that is delivered from the processing unit 24 is supposed to be 0.5 μsec like the first pulse shown in FIG. 6B. Then, the voltage generated at the secondary winding L2 of the trigger coil 22 (i.e., the output voltage of the trigger coil 22) becomes ±1.6 kilovolts as the peak value like the first AC impulse high voltage shown FIG. 6C, so that the ion generating element A having the discharge start voltage of ±1.5 kilovolts can discharge. However, under this condition the ion generating element B having the discharge start voltage of ±2.0 kilovolts cannot discharge. Therefore, the pulse width of the pulse signal delivered from the processing unit 24 is maintained to be 0.5 μsec as shown in FIG. 6B, while the voltage applied to the trigger coil 22 from the DC power supply 26 (i.e., the input voltage of the trigger coil 22) is increased to be 10 volts as shown in FIG. 6A. In this case, the voltage generated at the secondary winding L2 of the trigger coil 22 (the output voltage of the trigger coil 22) increases to ±2.1 kilovolts as the peak value like the second AC impulse high voltage shown in FIG. 6C, so that the ion generating element B having the discharge start voltage of ±2.0 kilovolts can discharge. A relationship between the voltage applied to the trigger coil 22 from the DC power supply 26 (the input voltage of the trigger coil 22) and the voltage generated at the secondary winding L2 of the trigger coil 22 (the output voltage of the trigger coil 22) in the second example is shown in Table 3.

TABLE 3

| IGE | DSV | Pulse Width | Input Voltage | Output Voltage |
|-----|-----|-------------|---------------|----------------|
| A | ±1.5 kV | 0.5 μsec | 5 V | ±1.6 kV |
| B | ±2.0 kV | 0.5 μsec | 10 V | ±2.1 kV |

IGE: ion generating element
DSV: discharge start voltage

The value 0.5 μsec as the pulse width and the values 5 volts and 10 volts as the voltage applied to the trigger coil 22 from the DC power supply 26 (the input voltage of the trigger coil 22) are merely example, and the output voltage of the trigger coil 22 varies in accordance with the number of turns of the windings L1 and L2 of the trigger coil 22, and the turned-on time of the MOSFET 23 and the like. In other words, the voltage generated at the secondary winding L2 of the trigger coil 22 (the output voltage of the trigger coil 22) can be controlled arbitrarily by adjusting the pulse width and the input voltage of the trigger coil 22 in accordance with the components that are used.

Figure 7A:
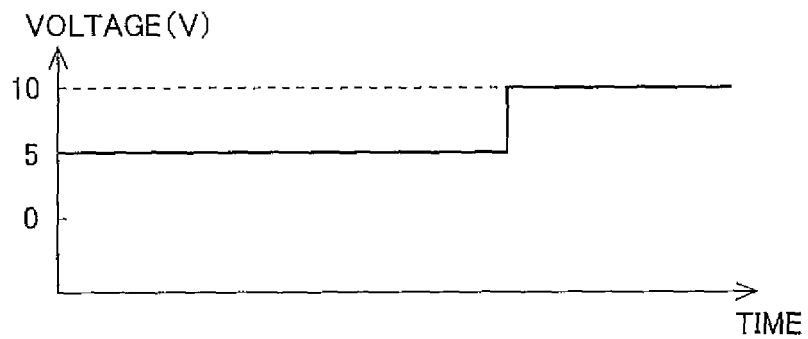
FIGS. 7A to 7C are diagrams showing voltage waveforms at individual portions of the ion generating device shown in FIG. 2.
Figure 7B:
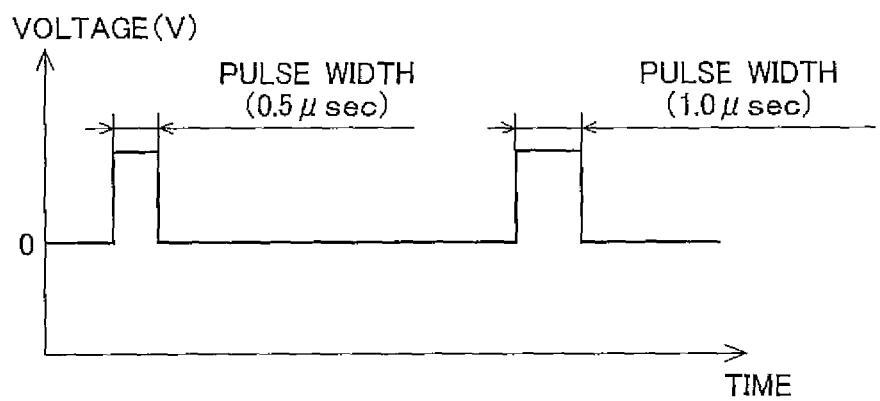
Figure 7C:
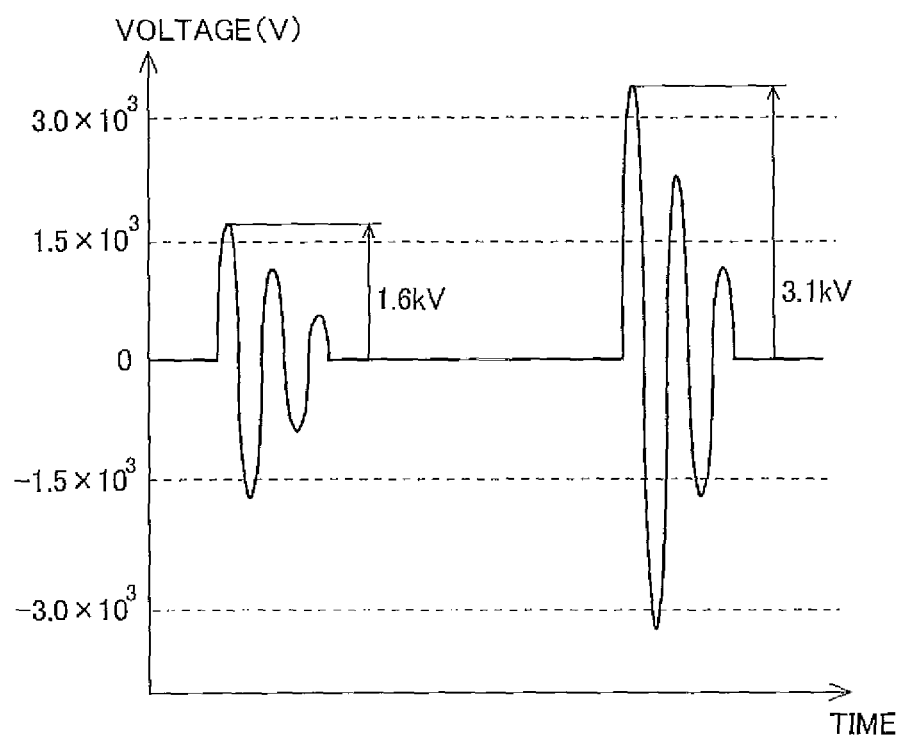

Next, a third example will be described, which is for performing the discharge of the ion generating elements having different discharge start voltage values as shown in Table 1 (the ion generating element A and the ion generating element C). The voltage that is applied to the trigger coil 22 from the DC power supply 26 (the input voltage of the trigger coil 22) is supposed to be 5 volts as shown in FIG. 7A, and the pulse width of the pulse signal that is delivered from the processing unit 24 is supposed to be 0.5 μsec like the first pulse shown in FIG. 7B. Then, the voltage that is generated at the secondary winding L2 of the trigger coil 22 (i.e., the output voltage of the trigger coil 22) becomes ±1.6 kilovolts as the peak value like the first AC impulse high voltage shown in FIG. 7C, so that the ion generating element A having the discharge start voltage of ±1.5 kilovolts can discharge. However, under this condition the ion generating element C having the discharge start voltage of ±3.0 kilovolts cannot discharge. Therefore, the voltage applied to the trigger coil 22 from the DC power supply 26 (i.e., the input voltage of the trigger coil 22) is increased to 10 volts as shown in FIG. 7A, while the pulse width of the pulse signal delivered from the processing unit 24 is increased to be 1.0 μsec like the second pulse shown in FIG. 7B. Then, the voltage generated at the secondary winding L2 of the trigger coil 22 (the output voltage of the trigger coil 22) increases to ±3.1 kilovolts as the peak value like the second AC impulse high voltage shown in FIG. 7C, so that the ion generating element C having the discharge start voltage of ±3.0 kilovolts can discharge. A relationship among the voltage applied to the trigger coil 22 from the DC power supply 26 (the input voltage of the trigger coil 22), the pulse width of the pulse signal delivered from the processing unit 24 and the voltage generated at the secondary winding L2 of the trigger coil 22 (the output voltage of the trigger coil 22) in the third example is shown in Table 4.

TABLE 4

| IGE | DSV | Pulse Width | Input Voltage | Output Voltage |
|-----|-----|-------------|---------------|----------------|
| A | ±1.5 kV | 0.5 μsec | 5 V | ±1.6 kV |
| C | ±3.0 kV | 1.0 μsec | 10 V | ±3.1 kV |

IGE: ion generating element
DSV: discharge start voltage

The values 0.5 μsec and 1.0 μsec as the pulse width and the values 5 volts and 10 volts as the voltage applied to the trigger coil 22 from the DC power supply 26 (the input voltage of the trigger coil 22) are merely example, and the output voltage of the trigger coil 22 varies in accordance with the number of turns of the windings L1 and L2 of the trigger coil 22, and the turned-on time of the MOSFET 23 and the like. In other words, the voltage generated at the secondary winding L2 of the trigger coil 22 (the output voltage of the trigger coil 22) can be controlled arbitrarily by adjusting the pulse width and the input voltage of the trigger coil 22 in accordance with the components that are used.

Figure 8A:
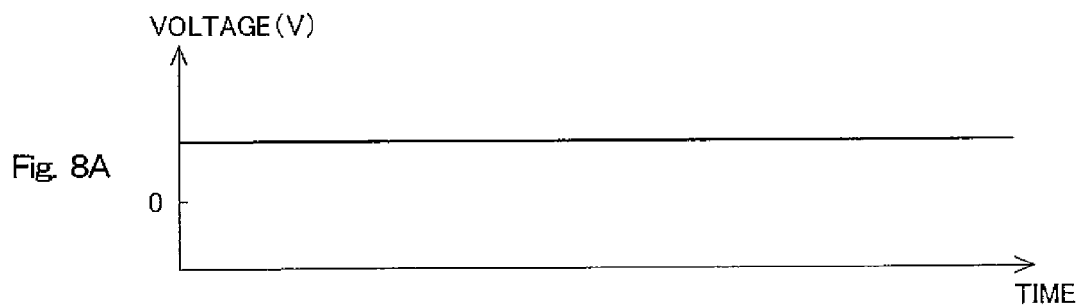
FIGS. 8A to 8C are diagrams showing voltage waveforms at individual portions of the ion generating device shown in FIG. 2.
Figure 8B:
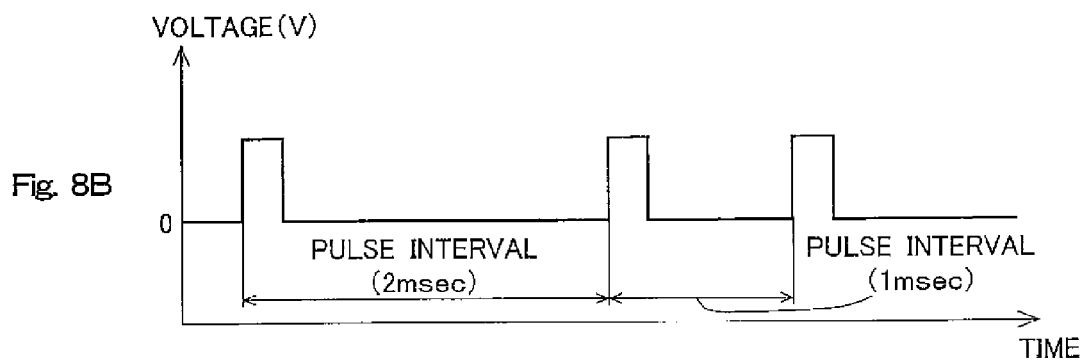
Figure 8C:
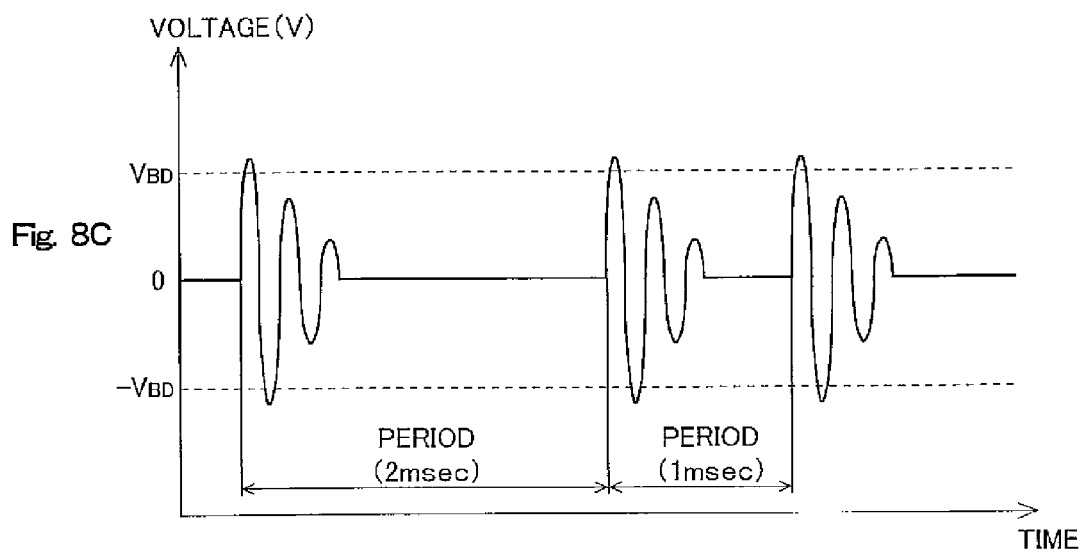

Next, an example will be described, in which the generating quantity of ions is increased as to the ion generating device shown in FIG. 2. If the pulse interval of the pulse signal delivered from the processing unit 24 is decreased from 2 milliseconds as the interval between the first pulse and the second pulse shown in FIG. 8B to 1 millisecond as the interval between the second pulse to the third pulse, a frequency of the voltage generated at the secondary winding L2 of the trigger coil 22 (the output voltage of the trigger coil 22) increases from the 500 Hz as a frequency of the first and the second AC impulse high voltages shown in FIG. 8C to 1 kHz as a frequency of the second and the third AC impulse high voltages. In other words, the number of discharge times at the discharging portion of the ion generating element 21 is doubled, so the generating quantity of ions is also doubled in theory.

Figure 9:
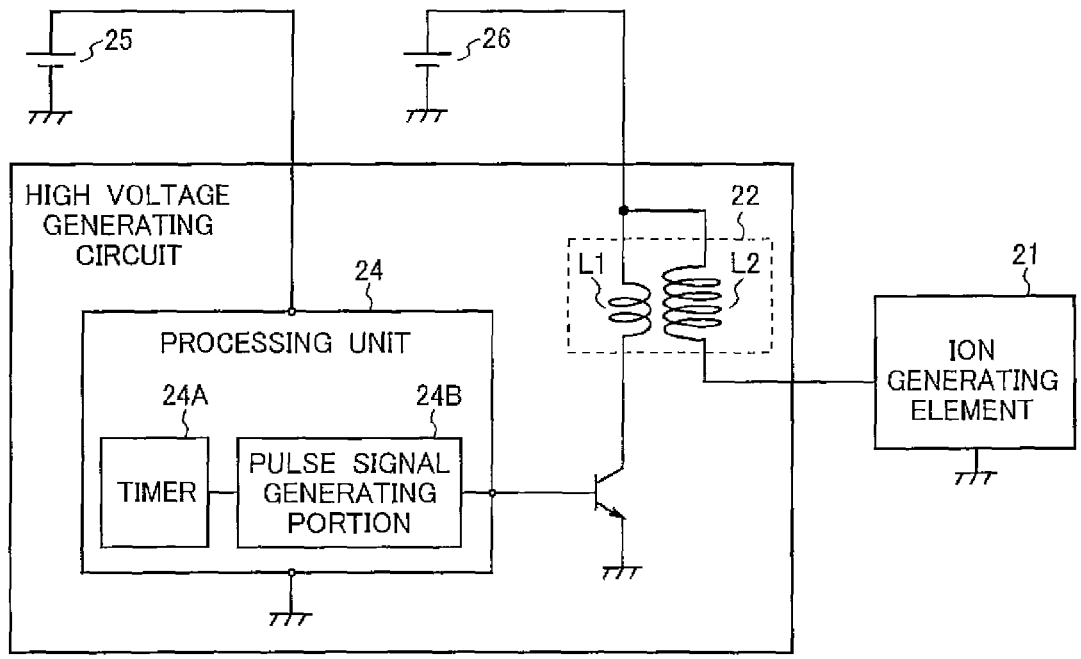
FIG. 9 is a circuit diagram showing another embodiment of the ion generating device shown in FIG. 1.

Furthermore, although the MOSFET 23 is used as the switching element for turning on and off the current flowing in the primary side of the boosting portion in the ion generating device shown in FIG. 2, it is possible to use a bipolar transistor instead of the MOSFET 23 to have the structure shown in FIG. 9 so that the same effect can be obtained.

Figure 10:
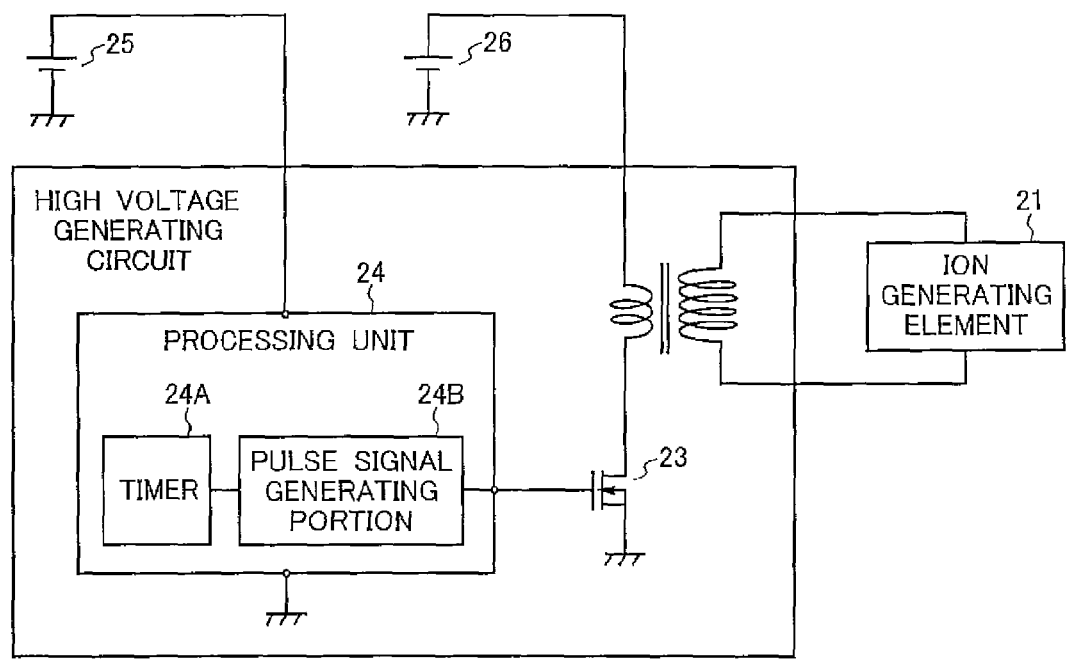
FIG. 10 is a circuit diagram showing still another embodiment of the ion generating device shown in FIG. 1.

Furthermore, although the trigger coil 22 is used as the boosting portion in the ion generating device shown in FIG. 2, it is possible to use a transformer instead of the trigger coil 22 to have the structure shown in FIG. 10 so that the same effect can be obtained. In this case, an end of the secondary winding of the transformer is connected electrically to the discharge electrode of the ion generating element 21, while the other end of the secondary winding of the transformer is connected electrically to the induction electrode of the ion generating element 21.

Figure 11:
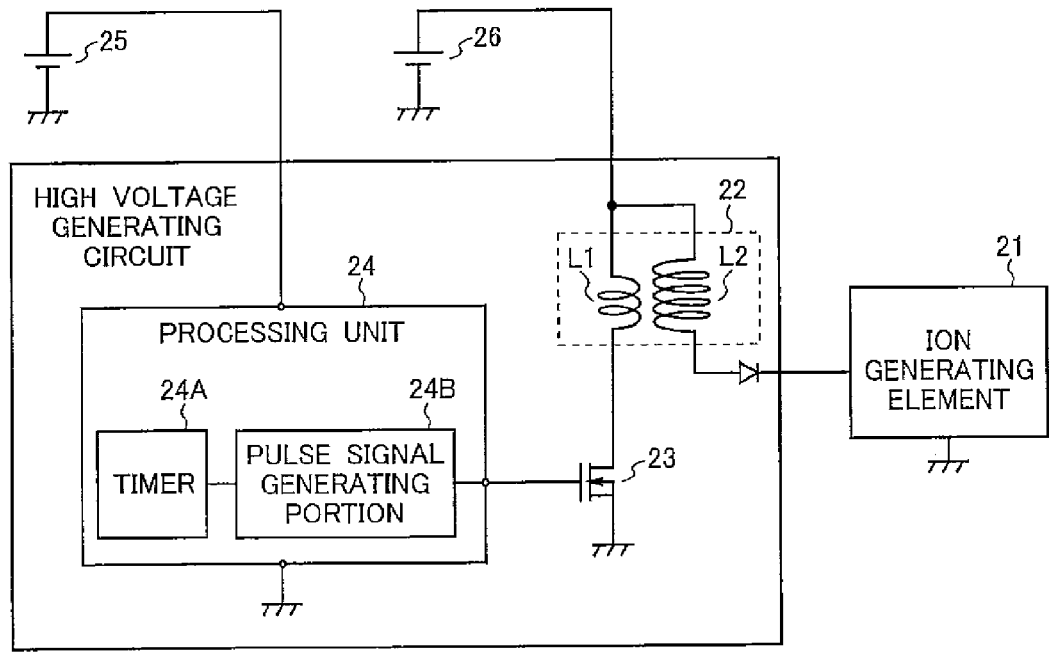
FIG. 11 is a diagram showing another structural example of the ion generating device according to the present invention.
Figure 12:
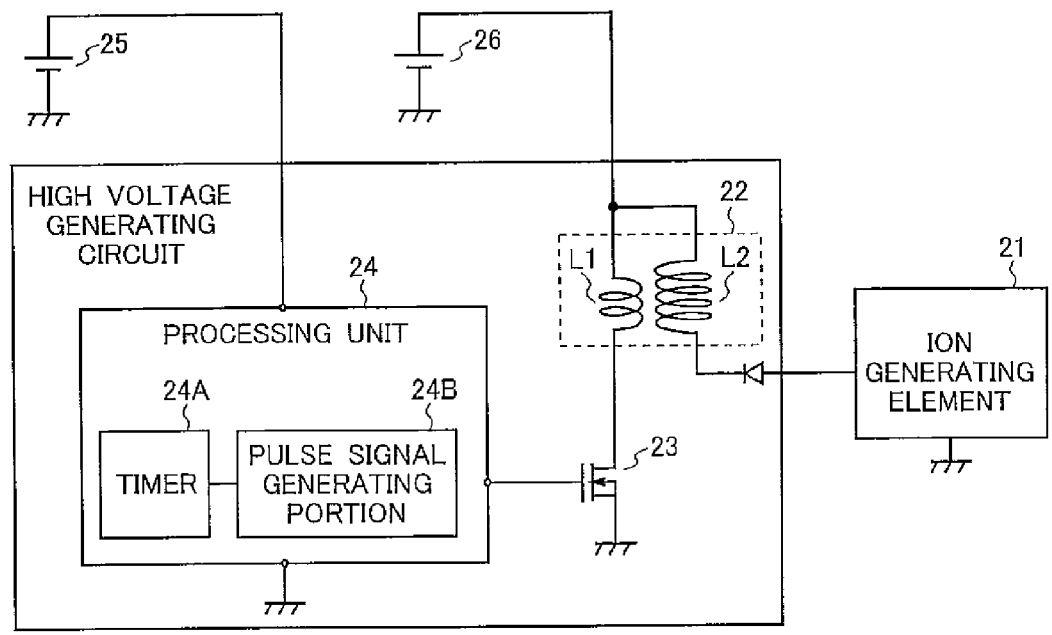
FIG. 12 is a diagram showing still another structural example of the ion generating device according to the present invention.

In addition, the ion generating device according to the present invention is not limited to the ion generating device that generates the plus ions and the minus ions by the same quantity. It is possible to adopt another structure in which a rectifying diode is disposed on the secondary side of the trigger coil 22 as shown in FIG. 11 of the ion generating device shown in FIG. 2 so that only plus ions are generated. Alternatively, it is possible to adopt another structure in which a rectifying diode is disposed on the secondary side of the trigger coil 22 as shown in FIG. 12 of the ion generating device shown in FIG. 2 so that only minus ions are generated. Although the ion generating device shown in FIGS. 11 and 12 cannot remove floating germs or the like, it can achieve the first to the fourth objects described above.

Furthermore, although one AC impulse high voltage is generated corresponding to one pulse in the pulse signal delivered from the processing unit 24 in FIGS. 4A to 4C, 5A to 5C, 6A to 6C, 7A to 7C and 8A to 8C, it is possible to adopt another structure in which one AC impulse high voltage is generated corresponding to a plurality of pulses in the pulse signal delivered from the processing unit 24.

Figure 13:
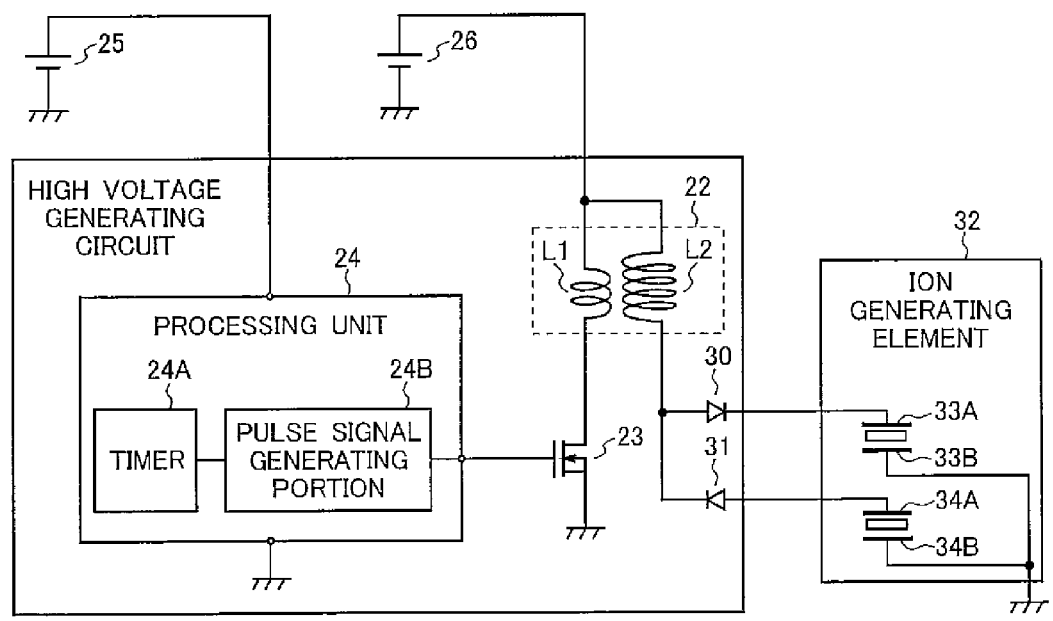
FIG. 13 is a diagram showing still another structural example of the ion generating device according to the present invention.

Next, a structural example of the ion generating device according to the present invention equipped with a plurality of discharging portions will be described with reference to FIG. 13. The ion generating device shown in FIG. 13 includes an ion generating element 32 having two discharging portions and the high voltage generating circuit that applies high voltage to the discharging portions. The high voltage generating circuit provided to the ion generating device shown in FIG. 13 has a structure including rectifying diodes 30 and 31 added to the high voltage generating circuit 200 provided to the ion generating device shown in FIG. 2. The anode of the rectifying diode 30 and the cathode of the rectifying diode 31 are connected to the secondary winding L2 of the trigger coil 22, and the cathode of the rectifying diode 30 is connected electrically to a first discharge electrode 33A of the first discharging portion of the ion generating element 32, and the anode of the rectifying diode 31 is connected electrically to a second discharge electrode 34A of the second discharging portion of the ion generating element 32. Furthermore, a first induction electrode 33B of the first discharging portion of the ion generating element 32 and a second induction electrode 34B of the second discharging portion of the same are connected to the ground.

According to this structure, plus ions are generated and emitted in the air by the first discharging portion of the ion generating element 32 to which the positive voltage is applied, while minus ions are generated and emitted in the air by the second discharging portion of the ion generating element 32 to which the negative voltage is applied. In other words, both plus and minus ions are emitted individually. Therefore, the generated plus ions and minus ions can be prevented from canceling each other and disappearing in the vicinity of the electrode of the ion generating element, so that the generated plus ions and minus ions can be emitted in the space effectively and with a balance.

Figure 14A:
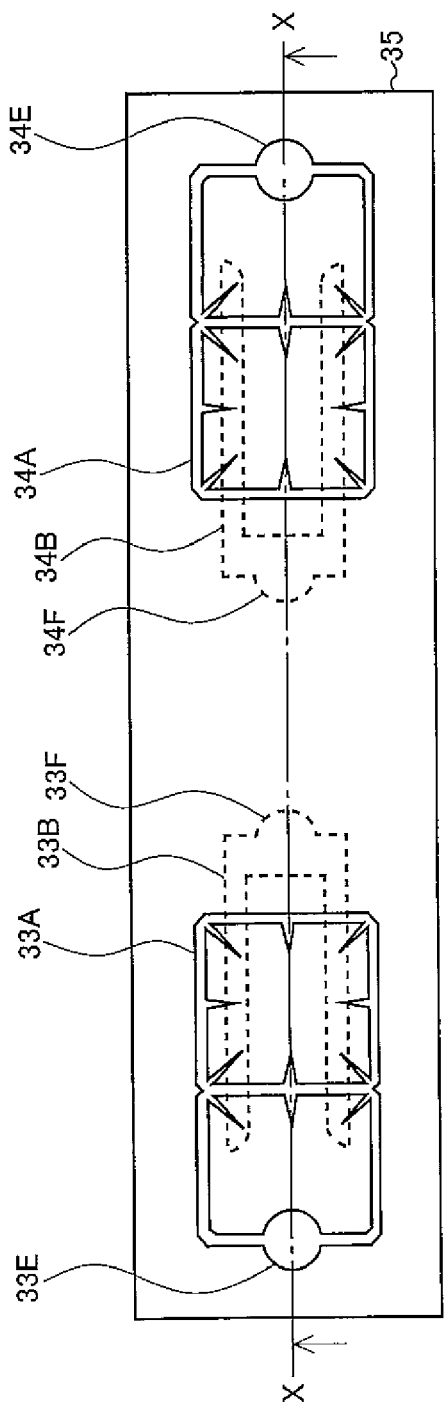
FIGS. 14A and 14B are diagrams showing a structural example of an ion generating element provided to the ion generating device shown in FIG. 13.
Figure 14B:
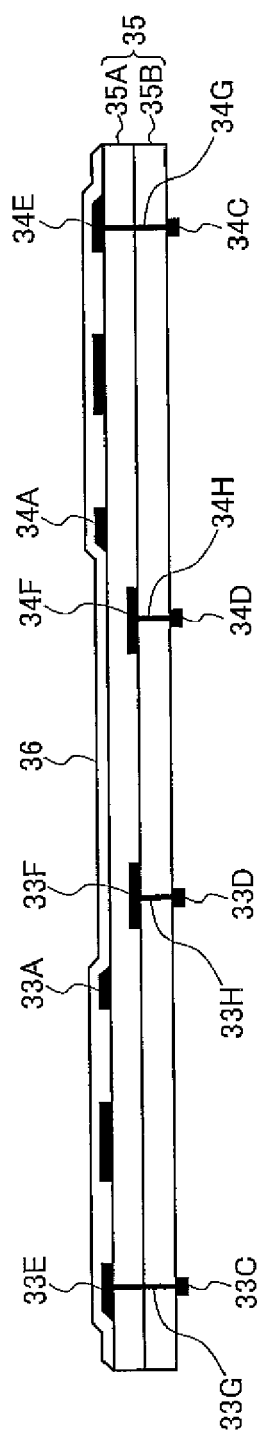
Figure 15:
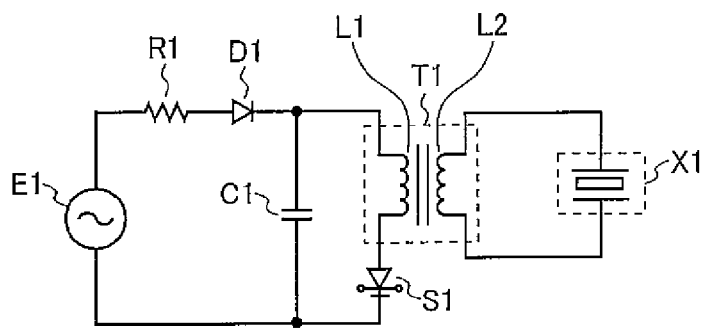
FIG. 15 is a circuit diagram showing an example of a conventional ion generating device.
Figure 16A:
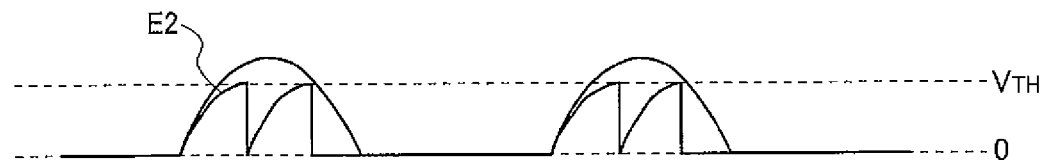
FIGS. 16A and 16B are diagrams showing voltage waveforms at individual portions of the conventional ion generating device shown in FIG. 15.
Figure 16B:
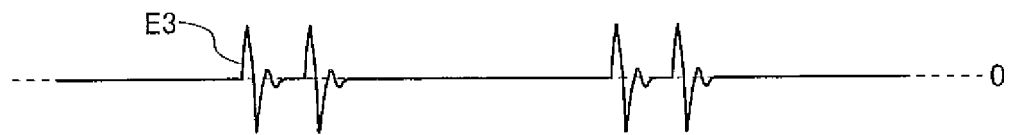
Figure 17:
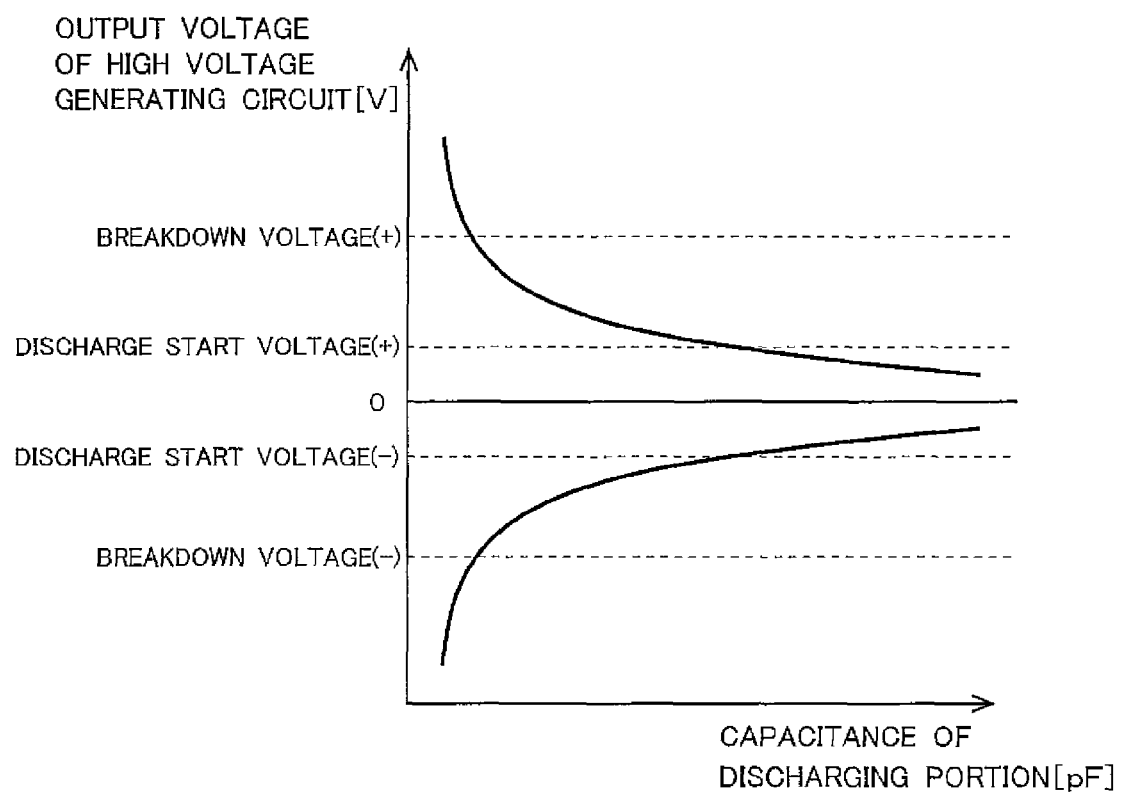
FIG. 17 is a diagram showing the situation in which output voltage of a high voltage generating circuit changes in accordance with capacitance of the discharging portion.

Here, a structural example of the ion generating element 32 is shown in FIGS. 14A and 14B. FIG. 14A is a top view of the ion generating element 32, and FIG. 14B is a cross section of the ion generating element 32 cut along the line X-X.

The ion generating element shown in FIGS. 14A and 14B includes a first discharging portion (the first discharge electrode 33A, the first induction electrode 33B, a discharge electrode contact 33C, an induction electrode contact 33D, connecting terminals 33E and 33F, and connecting channels 33G and 33H), a second discharging portion (the second discharge electrode 34A, the second induction electrode 34B, a discharge electrode contact 34C, an induction electrode contact 34D, connecting terminals 34E and 34F, and connecting channels 34G and 34H), a dielectric 35 (an upper dielectric 35A and a lower dielectric 35B), and a coating layer 36. The ion generating element shown in FIGS. 14A and 14B has a structure in which two ion generating elements shown in FIGS. 3A and 3B are combined. The structure of the ion generating element shown in FIGS. 3A and 3B is already described in detail, so detailed description of the structure of the ion generating element shown in FIGS. 14A and 14B will be omitted.

Figure 18:
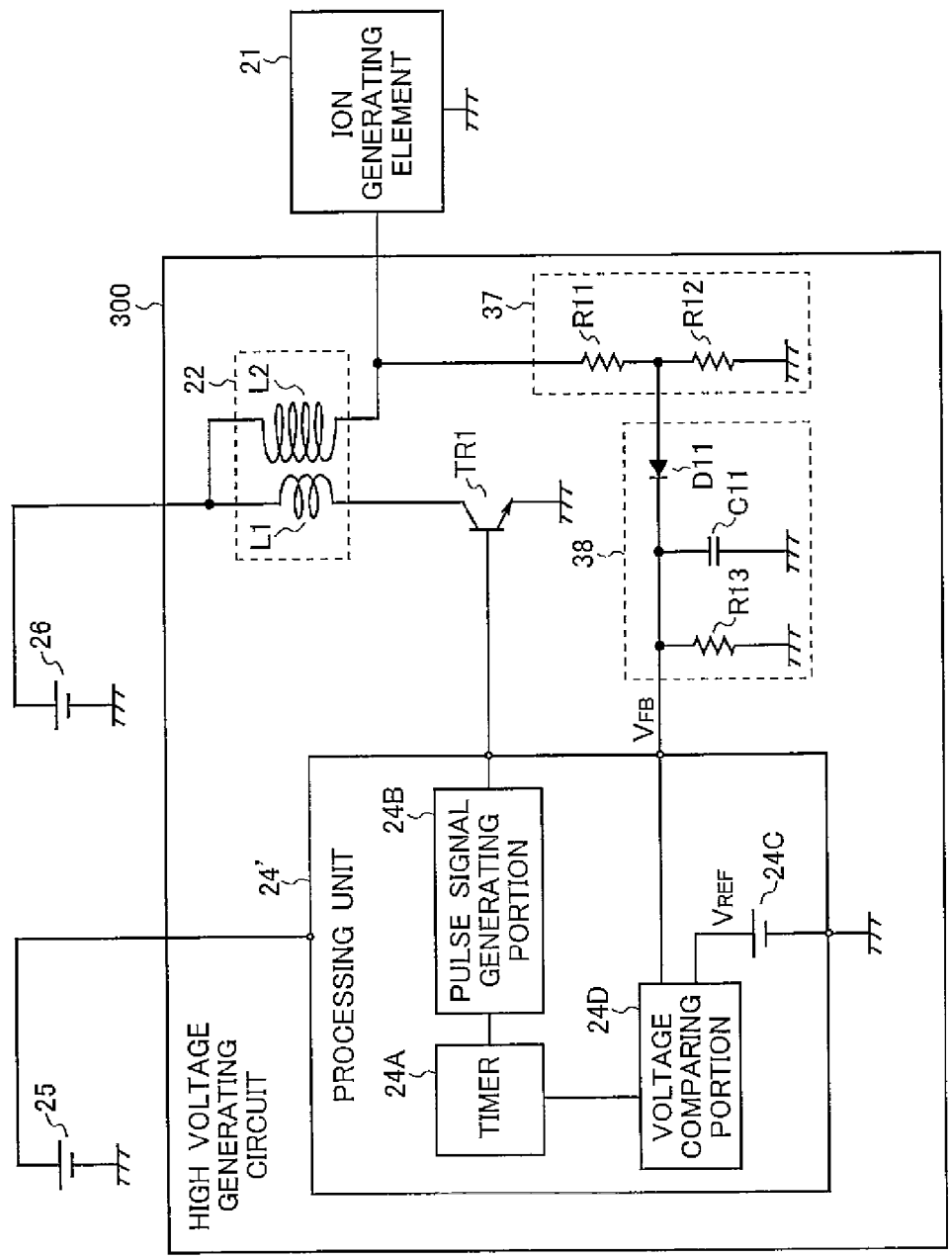
FIG. 18 is a circuit diagram showing an embodiment of the ion generating device according to the present invention equipped with the high voltage generating circuit that can maintain the output voltage to be a constant value.

Next, the ion generating device that can achieve the fifth object described above will be described. FIG. 18 is a circuit diagram showing an embodiment of the ion generating device that can achieve the fifth object described above. Note that the same parts in FIG. 18 as those in FIG. 2 will be denoted by the same references.

The ion generating device shown in FIG. 18 is equipped with the high voltage generating circuit that can maintain the output voltage to be a constant value by a feedback of the delivered high voltage value, and it can adjust so as to maintain the output to be a constant value even if the value of the high voltage delivered from the high voltage generating circuit is decreased because of increase of capacitance of the discharging portion.

The ion generating device shown in FIG. 18 includes the ion generating element 21 having the discharging portion and a high voltage generating circuit 300 for applying high voltage to the discharging portion. The high voltage generating circuit 300 includes the trigger coil 22 as the boosting portion that boosts the DC voltage delivered from the DC power supply 26 and supplies the high voltage to the discharging portion that is connected to the secondary side, a bipolar transistor TR1 as the switching element that turns on and off current flowing in the primary side of the trigger coil 22, a processing unit 24' having the pulse signal generating portion 24B that generates the pulse signal for controlling on and off of the bipolar transistor TR1, the timer 24A for adjusting pulse width and pulse interval of the pulse signal, a reference voltage circuit 24C for delivering reference voltage $V_{REF}$, and a voltage comparing portion 24D for comparing the feedback voltage $V_{FB}$ with the reference voltage $V_{REF}$, a voltage divider circuit 37 having resistors R11 and R12 for dividing the high voltage boosted by the trigger coil 22, and a peak hold circuit 38 having a diode D11, a capacitor C11 and a resistor R13 for rectifying the output voltage of the voltage divider circuit 37 and smoothing the same so as to generate the feedback voltage $V_{FB}$. As an example of the processing unit 24', there is a microcomputer for controlling by software the generation of the pulse signal, the adjustment of pulse width and pulse interval of the pulse signal and comparison of the feedback voltage $V_{FB}$ with the reference voltage $V_{REF}$, or a customer specific LSI for controlling by hardware the generation of the pulse signal, the adjustment of the pulse width and the pulse interval of the pulse signal and comparison of the feedback voltage $V_{FB}$ with the reference voltage $V_{REF}$.

A positive electrode of the DC power supply 25 is connected to a power source terminal of the processing unit 24'. A positive electrode of the DC power supply 26 is connected to an end of a primary winding L1 and an end of a secondary winding L2 of the trigger coil 22. A negative electrode of the DC power supply 25, a negative electrode of the DC power supply 26 and a GND terminal of the processing unit 24' are connected to the ground. The other end of the primary winding L1 of the trigger coil 22 is connected to a collector terminal of an npn-type bipolar transistor TR1. An emitter terminal of the bipolar transistor TR1 is connected to the ground. A base terminal of the bipolar transistor TR1 is connected to a pulse signal output terminal of the processing unit 24'. The other end of the secondary winding L2 of the trigger coil 22 is connected to a discharge electrode of the discharging portion of the ion generating element 21 and an end of the resistor R11. An induction electrode of the discharging portion of the ion generating element 21 is connected to the ground. The other end of the resistor R11 is connected to an end of the resistor R12 and an anode terminal of the diode D11. The other end of the resistor R11 is connected to the ground. A cathode terminal of the diode D11 is connected to an end of the capacitor C11, an end of the resistor R13 and an input terminal of feedback voltage of the processing unit 24'. The other end of the capacitor C11 and the other end of the resistor R13 are connected to the ground. For example, if the high voltage generating circuit 300 applies the AC impulse high voltage having a peak value of ±1.5 kilovolts to the ion generating element 21 and if the feedback voltage $V_{FB}$ is set to a value of +1.5 volts, constants of the circuit elements are set as follows, for example. A resistance value of the resistor R11 is set to 1 megohms, a resistance value of the resistor R12 is set to 1 kilohms, a capacitance value of the capacitor C11 is set to 0.01 microfarads, and a resistance value of the resistor R13 is set to 1 megohm.

Next, an operation of the ion generating device shown in FIG. 18 will be described. As for the ion generating device shown in FIG. 18, when the bipolar transistor TR1 is turned on temporarily by the pulse signal delivered from the processing unit 24' so that current flows in the primary winding L1 of the trigger coil 22, its mutual induction makes the secondary winding L2 of the trigger coil 22 generate high voltage determined by the turns ratio, which is applied to the discharge electrode of the discharging portion of the ion generating element 21. At the same time, the high voltage generated by the trigger coil 22 is divided by the voltage divider circuit 37 that includes the resistor R11 and the resistor R12. The output voltage of the voltage divider circuit 37 is supplied to the peak hold circuit 38 and is rectified by the diode D11. Then, a peak value of the voltage is held by the capacitor C11 and the resistor R13 and is converted into the feedback voltage VFB. The feedback voltage VFB delivered from the peak hold circuit 38 is supplied to the feedback input terminal of the processing unit 24'. Then, the voltage comparing portion 24D of the processing unit 24' compares the feedback voltage VFB with the reference voltage VREF. If the feedback voltage VFB is always lower than the reference voltage VREF during a predetermined period, i.e., if the output voltage of the high voltage generating circuit 300 drops, the timer 24A changes its setting so as to increase only the pulse width of the pulse signal delivered from the processing unit 24' without changing the pulse interval of the same. Thus, if the output voltage of the high voltage generating circuit 300 drops, the pulse width of the pulse signal delivered from the processing unit 24' is increased so that the output voltage of the high voltage generating circuit 300 increases. Therefore, the output voltage of the high voltage generating circuit 300 can be maintained at a constant value.

After that, the bipolar transistor TR1 is turned off so that high voltage is not applied to discharge electrode of the discharging portion of the ion generating element 21 until the next pulse signal is delivered at a time interval controlled by the timer 24A of the processing unit 24'. The operation of generating the high voltage is repeated responding to the pulse signal that is produced at an interval controlled by the timer 24A of the processing unit 24'.

Figure 19A:
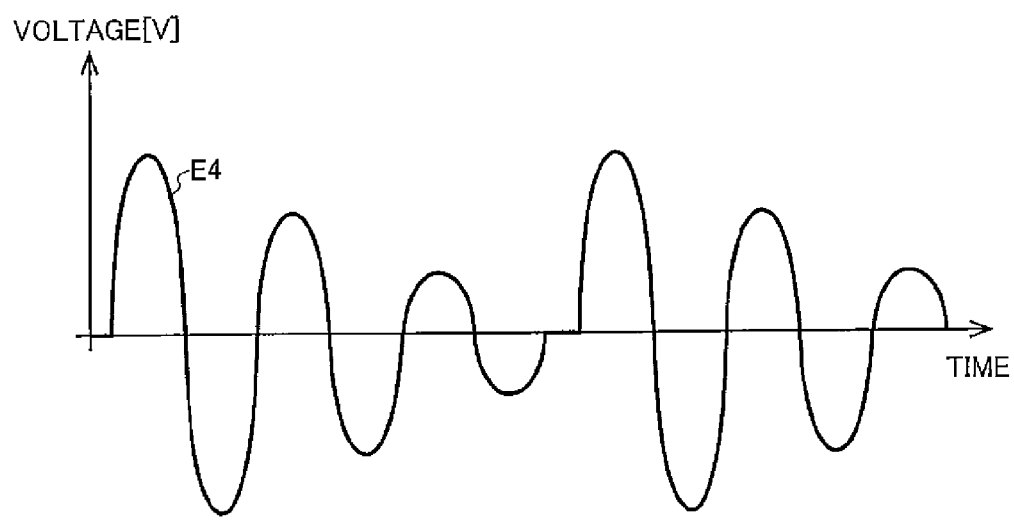
FIGS. 19A and 19B are diagrams showing voltage waveforms at individual portions of a peak hold circuit provided to the ion generating device shown in FIG. 18.
Figure 19B:
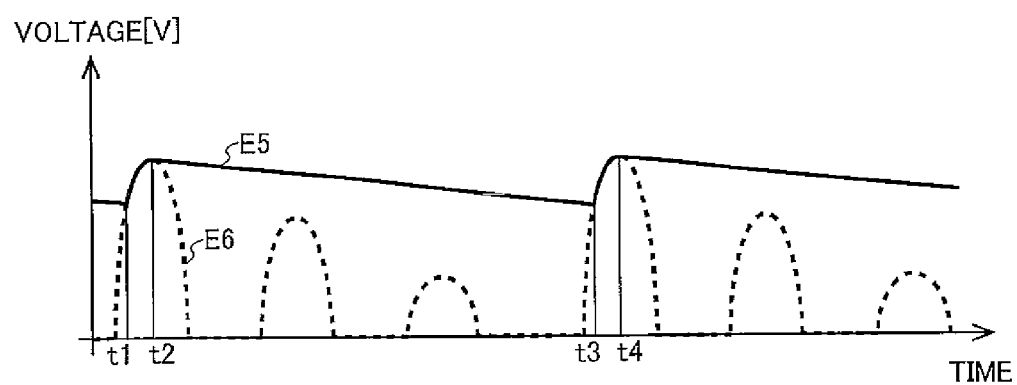

Here, an operation of the peak hold circuit 38 will be described with reference to FIGS. 19A and 19B. FIGS. 19A and 19B are diagrams showing voltage waveforms at individual portions of the peak hold circuit 38. The voltage E4 shown in FIG. 19A is an input voltage of the peak hold circuit 38. The voltage E5 shown in FIG. 19B is a voltage after rectification by the diode D11 and peak hold by the capacitor C11 and the resistor R13, which is the output voltage of the peak hold circuit 38. The voltage E6 shown in FIG. 19B is the voltage after rectification by the diode D11. The input voltage E4 of the peak hold circuit 38 is rectified by the diode D11 as the half-wave rectification to be the voltage E6 shown in FIG. 19B. Then, the capacitor C11 is charged as the voltage E6 after the half-wave rectification increases during the period t1-t2. Since the time for the capacitor C11 to be charged is usually short, the output voltage E5 of the peak hold circuit 38 substantially follows the voltage E6 after the half-wave rectification. After that, the capacitor C11 is discharged during the period t2-t3. The discharge time is determined by a time constant that is a product of a capacitance value of the capacitor C11 and a resistance value of the resistor R13. During the period in which the capacitor C11 is being discharged, the output voltage E5 of the peak hold circuit 38 does not follow the voltage E6 after the half-wave rectification. As a result, the output voltage E5 of the peak hold circuit 38 has a smooth waveform after the peak hold compared with the input voltage E4 of the peak hold circuit 38.

Figure 20A:
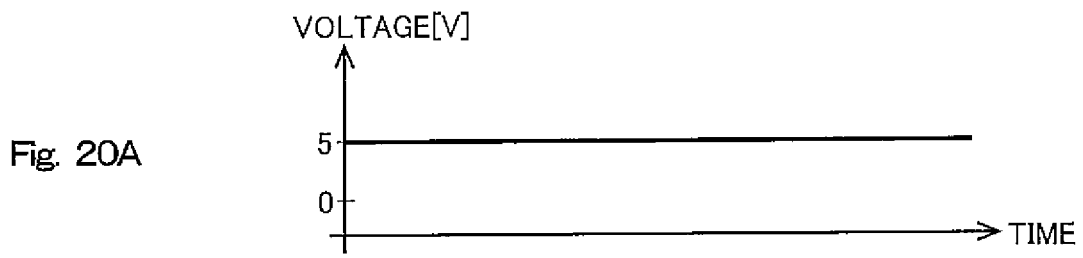
FIGS. 20A to 20E are diagrams showing voltage waveforms at individual portions of the ion generating device shown in FIG. 18.
Figure 20B:
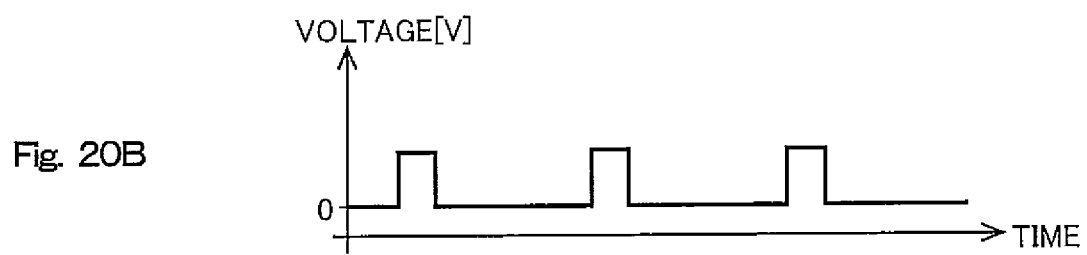
Figure 20C:
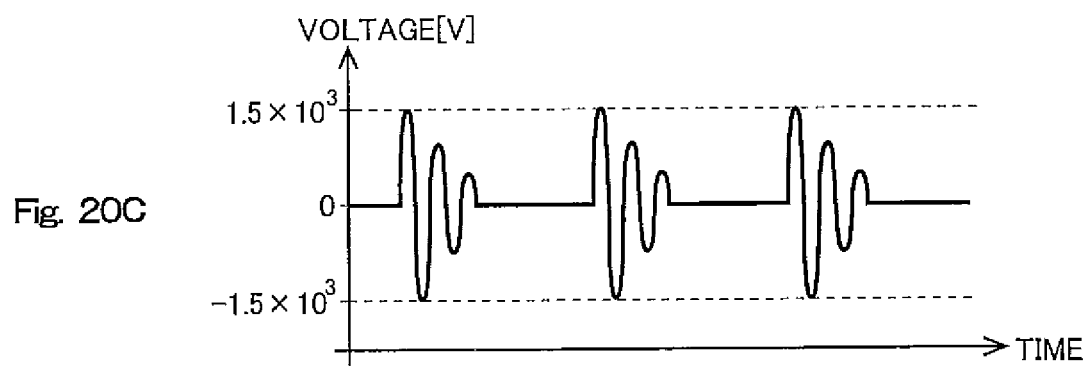
Figure 20D:
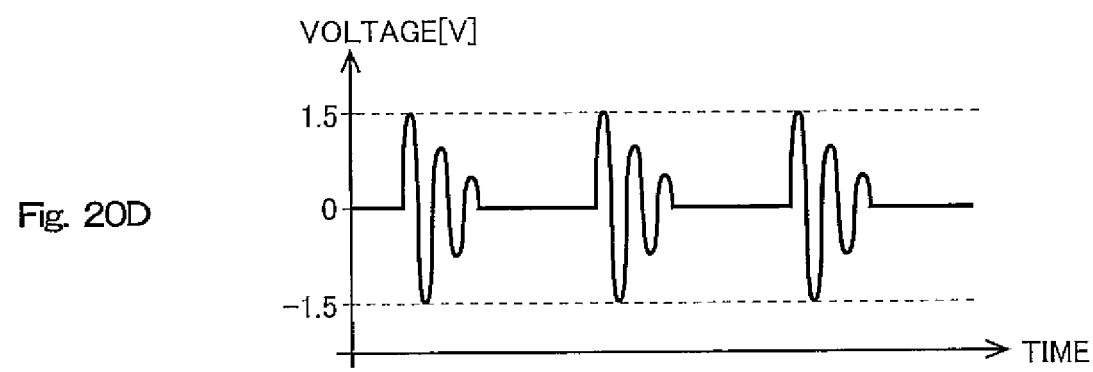
Figure 20E:
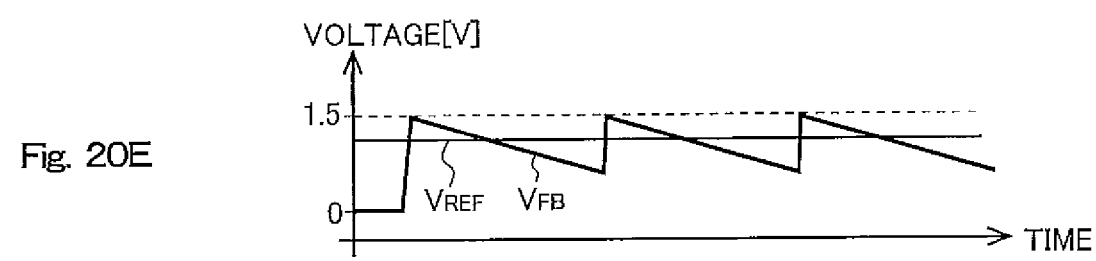

Voltages at individual portions of the ion generating device shown in FIG. 18 have waveforms as shown in FIGS. 20A to 20E. Here, FIG. 20A shows a waveform of the voltage applied to the trigger coil 22 from the DC power supply 26, i.e., a waveform of the input voltage of the trigger coil 22, FIG. 20B shows a waveform of the pulse signal delivered from the processing unit 24', i.e., a waveform of a base signal of the bipolar transistor TR1, FIG. 20C shows a waveform of the output voltage of the trigger coil 22, FIG. 20D shows a waveform of a voltage supplied to the peak hold circuit 38 from the voltage divider circuit 37, and FIG. 20E shows a waveform of the feedback voltage $V_{FB}$ delivered from the peak hold circuit 38 and a waveform of the reference voltage $V_{REF}$ delivered from the reference voltage circuit 24C of the processing unit 24'.

Figure 21A:
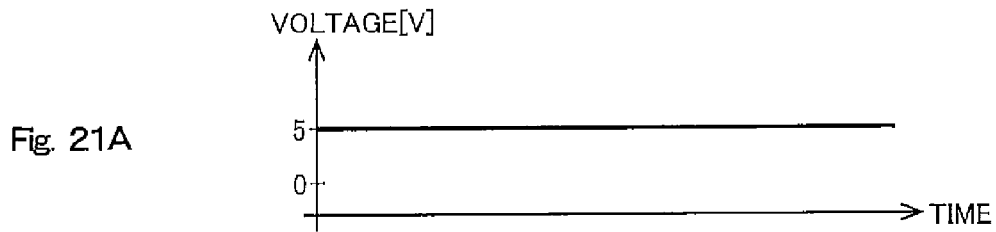
FIGS. 21A to 21E are diagrams showing voltage waveforms at individual portions of the ion generating device shown in FIG. 18 in the case where the capacitance of the discharging portion in the ion generating element increases.
Figure 21B:
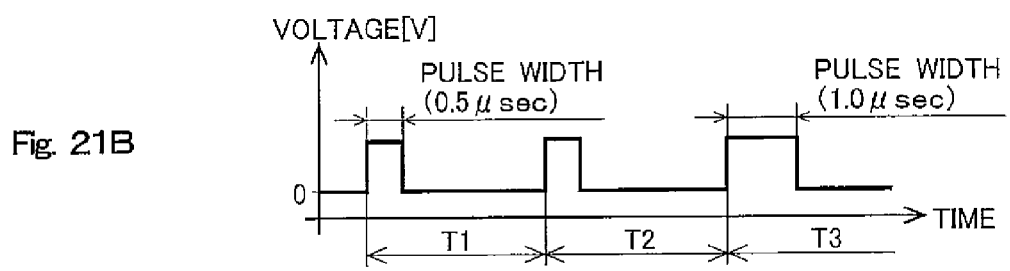
Figure 21C:
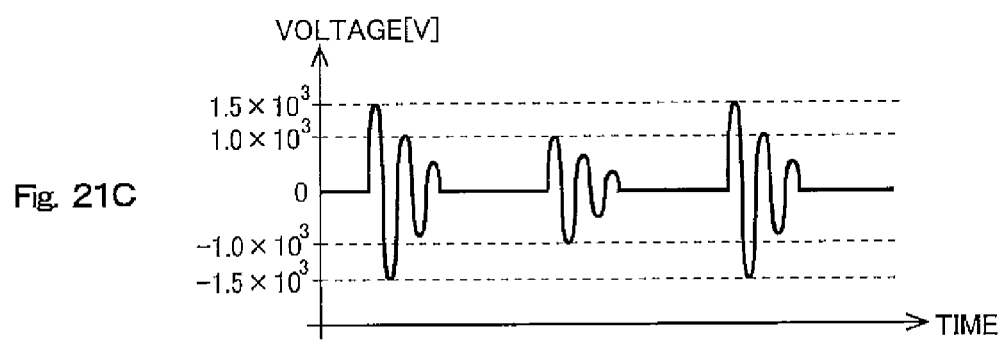
Figure 21D:
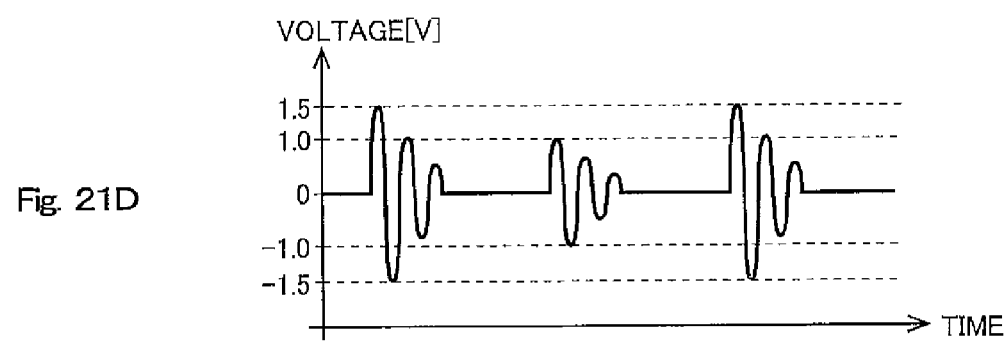
Figure 21E:
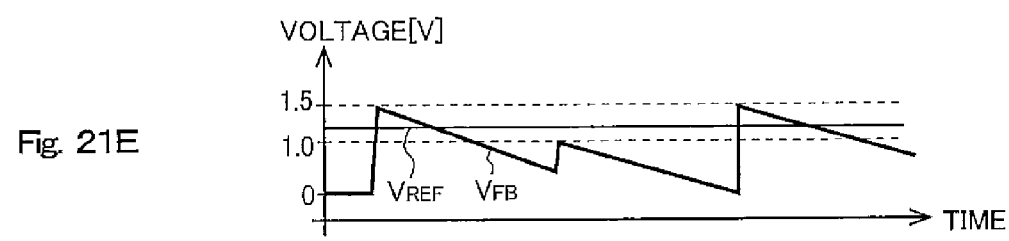

FIGS. 21A to 21E show voltage waveforms at individual portions of the ion generating device shown in FIG. 18, indicating the state in which the feedback circuit (the voltage divider circuit 37, the peak hold circuit 38, the reference voltage circuit 24C, and the voltage comparing portion 24D) works for maintaining the output voltage of the high voltage generating circuit 300 when the output voltage of the high voltage generating circuit 300 decreases in accordance with an influence of the increase of capacitance in the discharging portion of the ion generating element 21. FIG. 21A shows a waveform of the voltage applied to the trigger coil 22 from the DC power supply 26, i.e., the input voltage of the trigger coil 22, FIG. 21B shows a waveform of the pulse signal delivered from the processing unit 24', i.e., the base signal of the bipolar transistor TR1, FIG. 21C shows a waveform of the output voltage of the trigger coil 22, FIG. 21D shows a waveform of the voltage that is supplied to the peak hold circuit 38 from the voltage divider circuit 37, FIG. 21E shows a waveform of the feedback voltage $V_{FB}$ delivered from the peak hold circuit 38 and a waveform of the reference voltage $V_{REF}$ delivered from the reference voltage circuit 24C in the processing unit 24'.

The timer 24A sets the pulse width in the next pulse interval in accordance with the output voltage level of the voltage comparing portion 24D at each pulse interval. In the first pulse interval T1 there is a period in which the output voltage of the voltage comparing portion 24D has a high level (see FIG. 21E), so the timer 24A sets the pulse width at the second pulse interval T2 to 0.5 μsec (standard value). In the second pulse interval T2, the output voltage of the high voltage generating circuit 300 drops under the influence of increase of capacitance in the discharging portion of the ion generating element (see FIG. 21C). As a result, the feedback voltage $V_{FB}$ is always below the reference voltage $V_{REF}$ so that there is no period in which the output voltage of the voltage comparing portion 24D has a high level (see FIG. 21E). Therefore, the timer 24A sets the pulse width at the third pulse interval T3 to 1.0 μsec detailed description thereof will be omitted.

Figure 25:
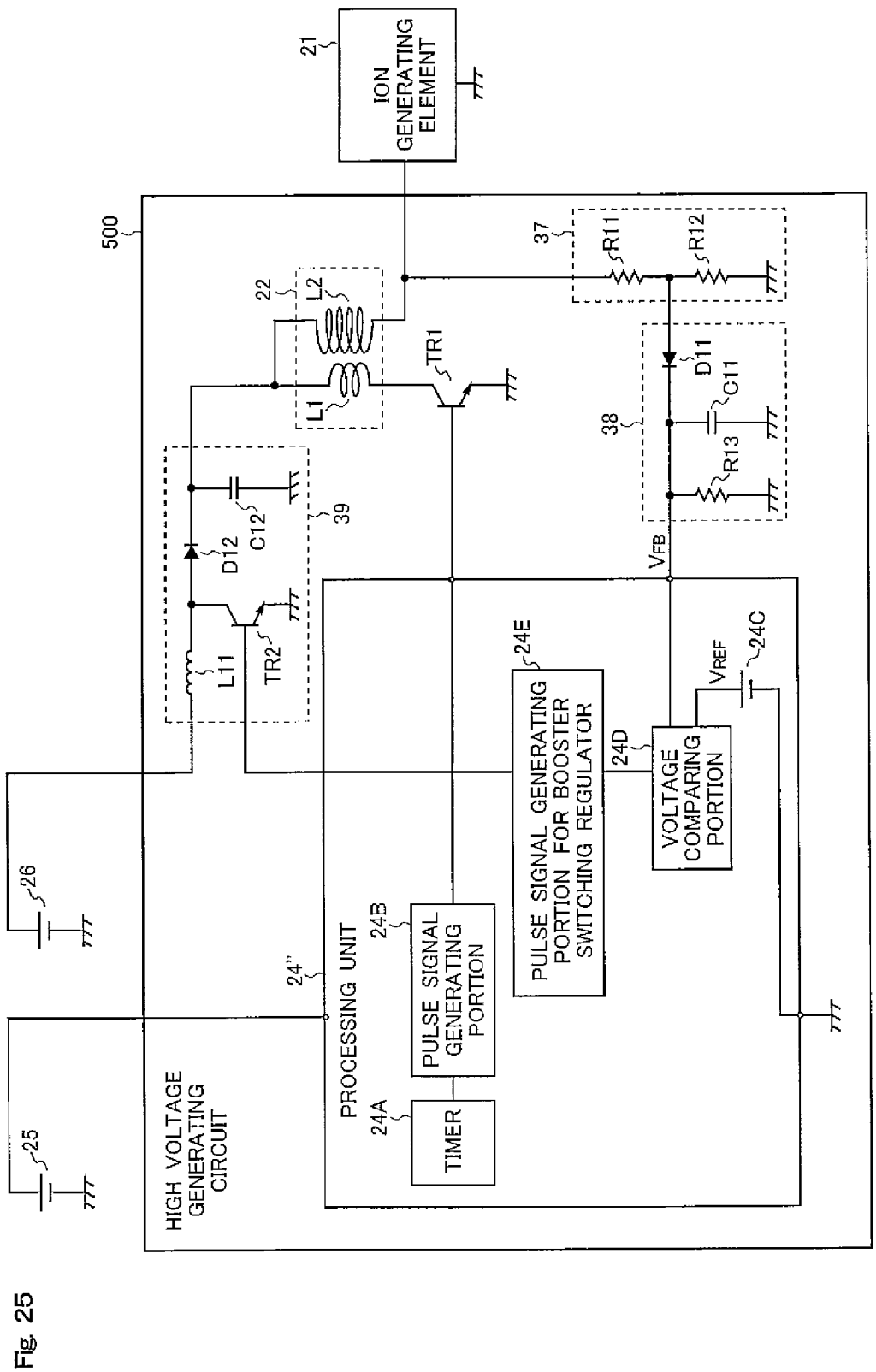
FIG. 25 is a circuit diagram showing still another embodiment of the ion generating device according to the present invention equipped with the high voltage generating circuit that can maintain the output voltage to be a constant value.

The ion generating device shown in FIG. 25 adopts a method of boosting the input voltage of the trigger coil 22 from the voltage of the DC power supply 26 by increasing the number of pulses per a predetermined time of a control signal for controlling the switching transistor of the chopper type booster switching regulator 39 (by increasing the number of switching times per a predetermined time) so as to increase the output voltage of a high voltage generating circuit 500 when the feedback voltage $V_{FB}$ is always below the reference voltage $V_{REF}$ during a predetermined period. Therefore, the ion generating device shown in FIG. 25 is different from the ion generating device shown in FIG. 18 in that the former has the additional booster switching regulator 39 and in the inner structure of the processing unit.

The booster switching regulator 39 includes a bipolar transistor TR2 that is a switching transistor, a coil L11, a diode D12, and a capacitor C12. A processing unit 24" includes an additional pulse signal generating portion 24E for the booster switching regulator that delivers a pulse signal for switching the booster switching regulator 39. The pulse width of the pulse signal for switching current that flows in the primary winding L1 of the trigger coil 22 can be constant. Therefore, it is structured so that a result of the voltage comparing portion 24D is not reflected on the timer 24A but is reflected on the number of pulses of the pulse signal delivered from the pulse signal generating portion 24E for the booster switching regulator.

Figure 26A:
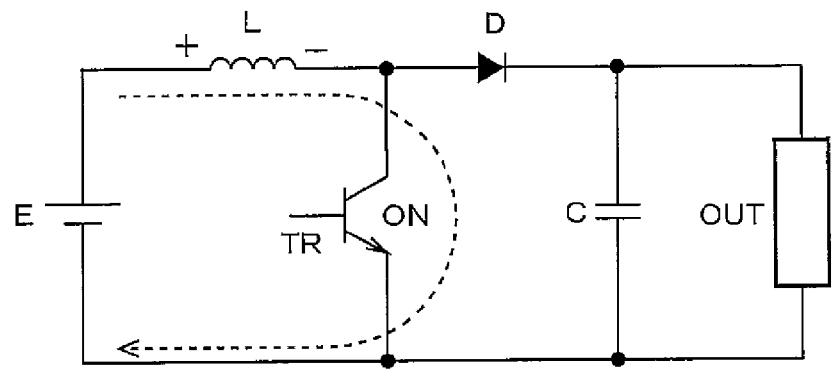
FIGS. 26A to 26C are diagrams showing an operation of a booster switching regulator.
Figure 26B:
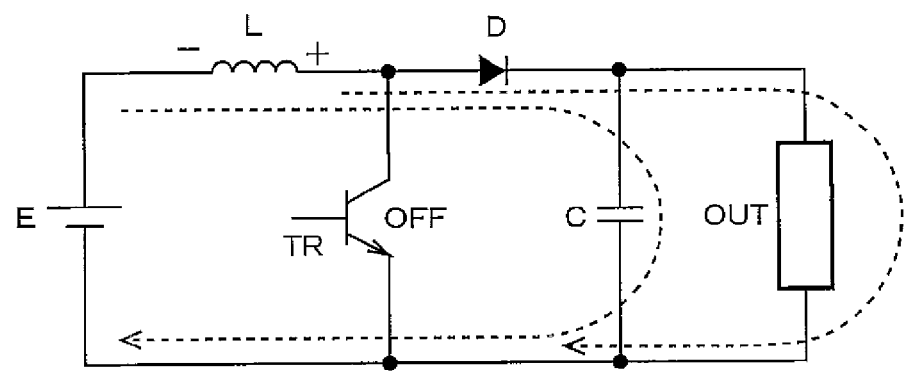
Figure 26C:
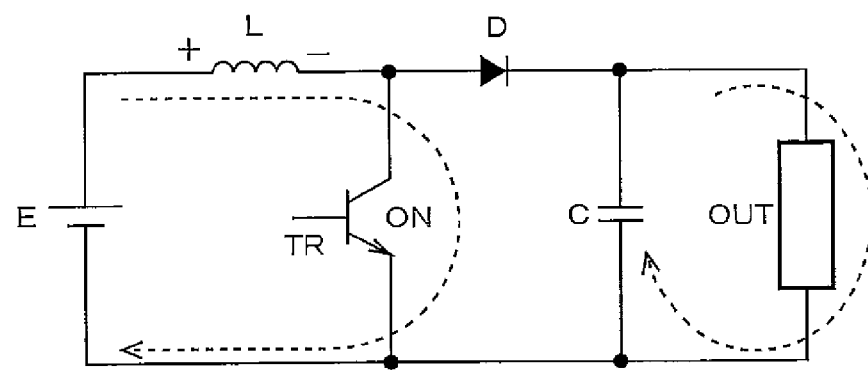

Here, an operation of the booster switching regulator having the same structure as the booster switching regulator 39 will be described with reference to FIGS. 26A to 26C. First, when the transistor TR is turned on, the energy is stored in the coil L. On this occasion, the input side of the coil L becomes positive potential while the output side of the same becomes negative potential (see FIG. 26A). Next, when the transistor TR is turned off, the coil L permits the current to flow continuously following Lenz's law, so that the stored energy is discharged. On this occasion, the output side of the coil L becomes positive potential while the input side becomes negative potential. Since the transistor TR is turned off, the current flows through the diode D into the capacitor C and the load OUT (see FIG. 26B). When the transistor TR is turned on again, the coil L stores energy again. The energy stored in the capacitor C causes current flowing in the load OUT. The energy stored in the capacitor C flows only into the load OUT without flowing into the transistor TR because of the diode D (see FIG. 26C). If energy stored in the coil is large, the energy to be stored in the capacitor C increases so that the voltage rises.

Figure 27A:
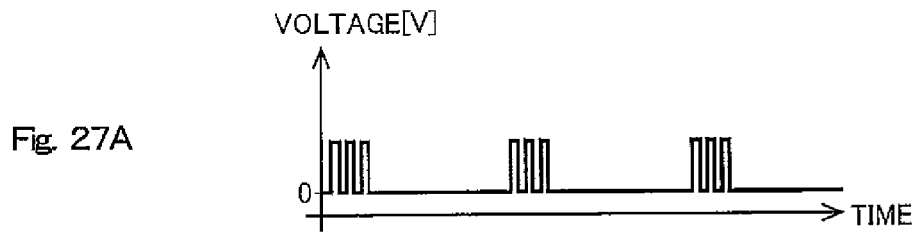
FIGS. 27A to 27F are diagrams showing voltage waveforms at individual portions of the ion generating device shown in FIG. 25.
Figure 27B:
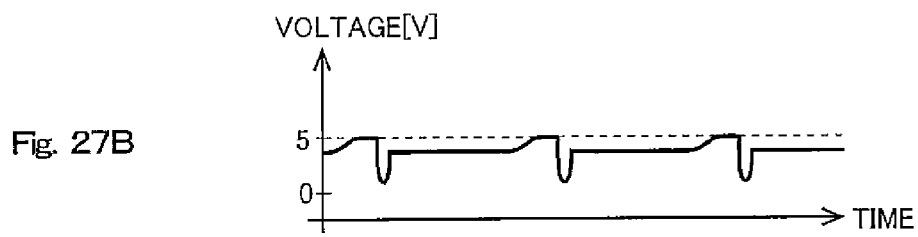
Figure 27C:
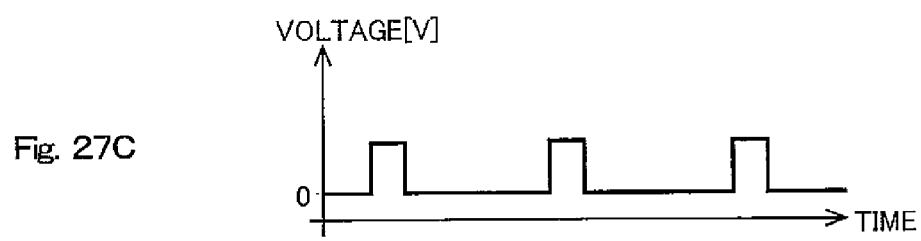
Figure 27D:
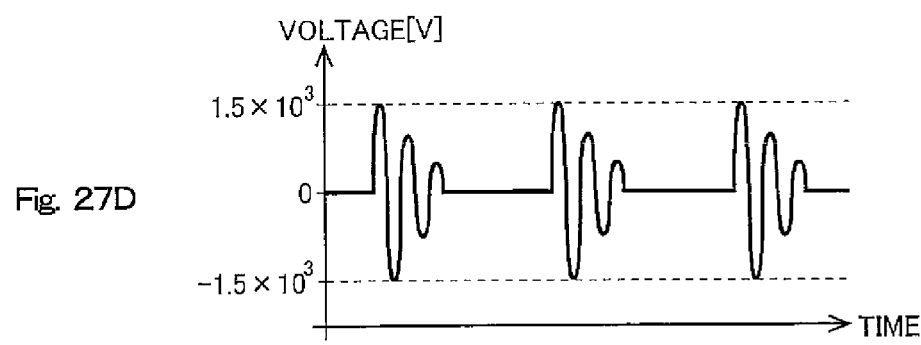
Figure 27E:
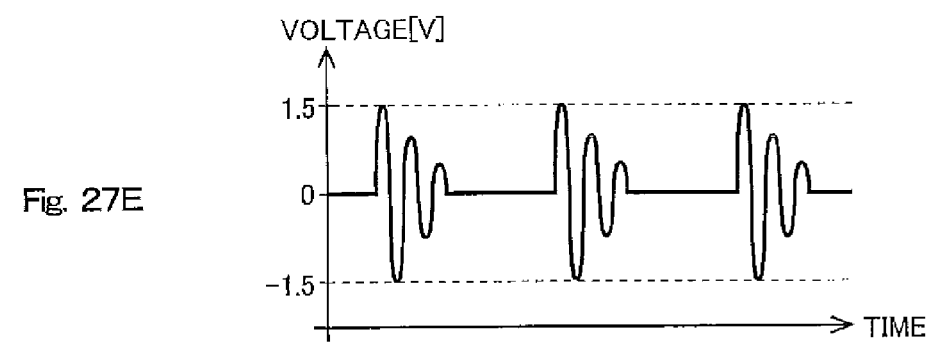
Figure 27F:
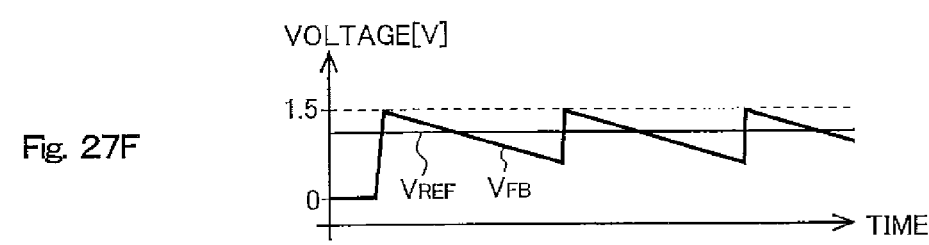

Voltages at individual portions of the ion generating device shown in FIG. 25 have waveforms as shown in FIGS. 27A to 27F. Here, FIG. 27A shows a waveform of the pulse signal delivered from the processing unit 24" to the booster switching regulator 39, i.e., a waveform of the base signal of the bipolar transistor TR2. FIG. 27B shows a waveform of the voltage to be applied to the trigger coil 22 that is boosted by the booster switching regulator 39 from the voltage of the DC power supply 26, i.e., a waveform of the input voltage of the trigger coil 22. FIG. 27C shows a waveform of the pulse signal delivered from the processing unit 24" to the bipolar transistor TR1, i.e., a waveform of the base signal of the bipolar transistor TR1. FIG. 27D shows a waveform of the output voltage of the trigger coil 22. FIG. 27E shows a waveform of the voltage that is supplied from the voltage divider circuit 37 to the peak hold circuit 38. FIG. 27F shows a waveform of the feedback voltage $V_{FB}$ delivered from the peak hold circuit 38 and the reference voltage $V_{REF}$ that is delivered from the reference voltage circuit 24C of the processing unit 24".

Figure 28A:
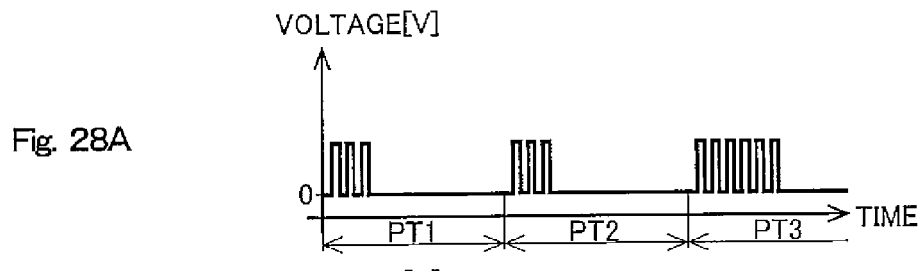
FIGS. 28A to 28F are diagrams showing voltage waveforms at individual portions of the ion generating device shown in FIG. 25 in the case where capacitance of the discharging portion in the ion generating element increases.
Figure 28B:
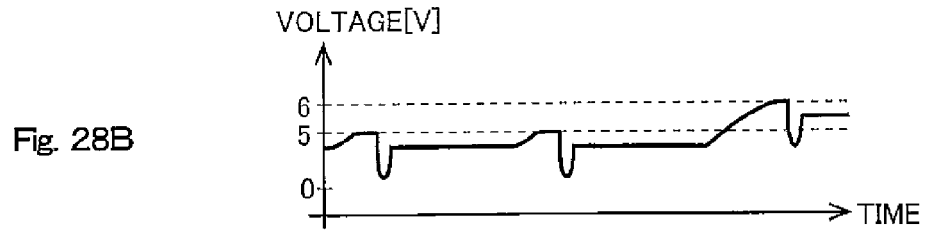

FIGS. 28A to 28F show voltage waveforms at individual portions of the ion generating device shown in FIG. 25, indicating the state in which the feedback circuit (including the voltage divider circuit 37, the peak hold circuit 38, the reference voltage circuit 24C, and the voltage comparing portion 24D) works for maintaining the output voltage of the high voltage generating circuit 500 when the output voltage of the high voltage generating circuit 500 drops in accordance with an influence of increase of capacitance in the discharging portion of the ion generating element 21. FIG. 28A shows a waveform of the pulse signal delivered from the processing unit 24" to the booster switching regulator 39, i.e., a waveform of the base signal of the bipolar transistor TR2. FIG. 28B shows a waveform of the voltage to be applied to the trigger coil 22 that is boosted by the booster switching regulator 39 from the voltage of the DC (see FIG. 21B). Note that the pulse width values 0.5 μsec and 1.0 μsec are examples.

Next, another embodiment of the ion generating device that can achieve the fifth object described above is shown in FIG. 22. Note that the same parts shown in FIG. 22 as those shown in FIG. 18 are denoted by the same references, so that detailed description thereof will be omitted.

Figure 22:
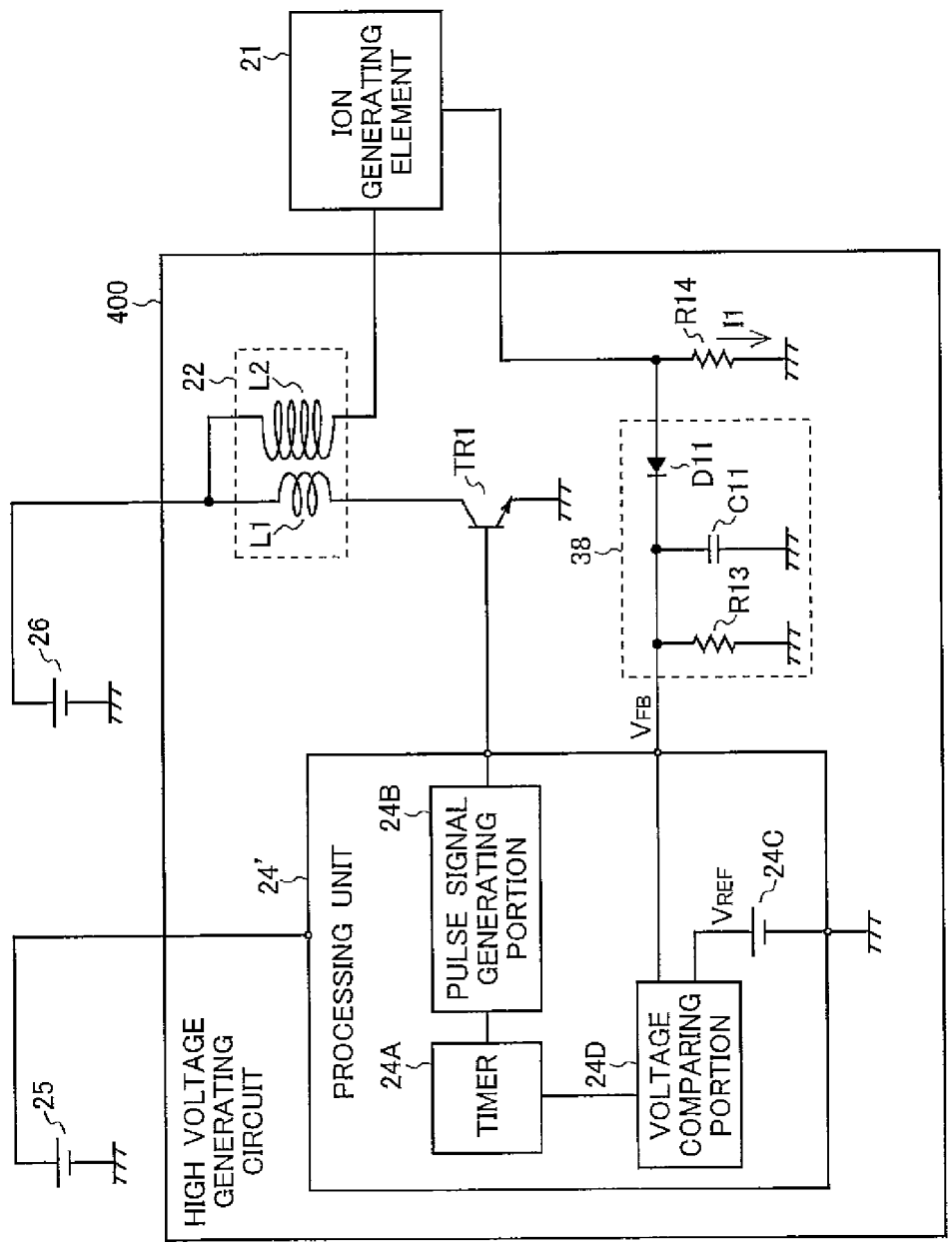
FIG. 22 is a circuit diagram showing another embodiment of the ion generating device according to the present invention equipped with the high voltage generating circuit that can maintain the output voltage to be a constant value.
Figure 23A:
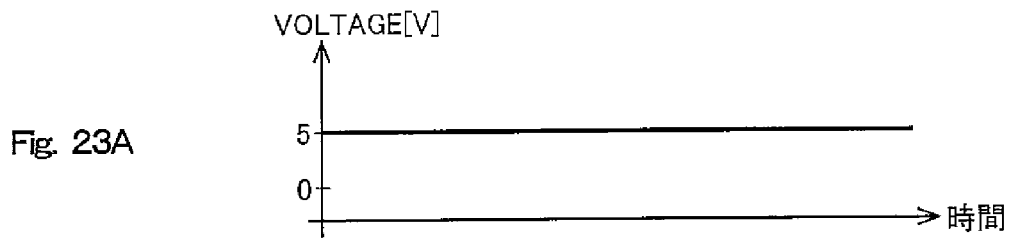
FIGS. 23A to 23E are diagrams showing voltage waveforms at individual portions of the ion generating device shown in FIG. 22.
Figure 23B:
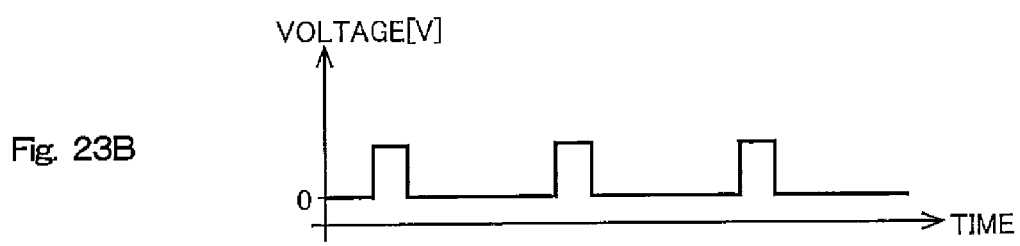
Figure 23C:
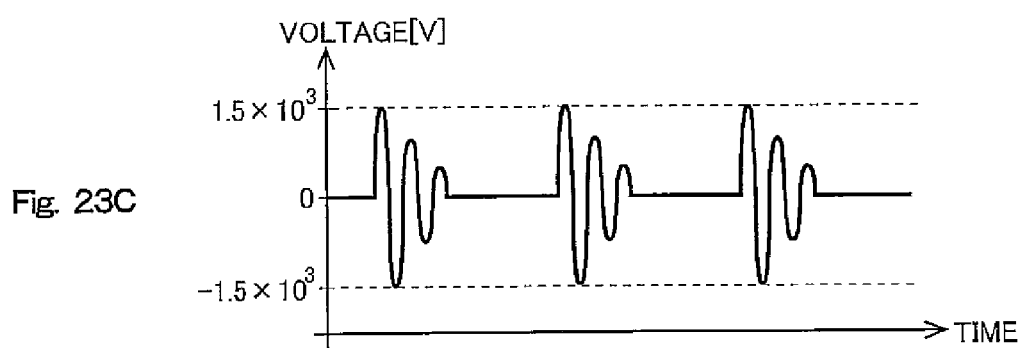
Figure 23D:
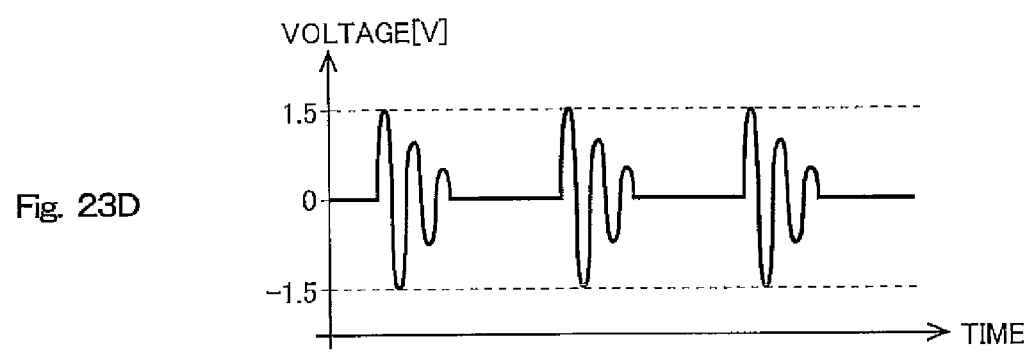
Figure 23E:
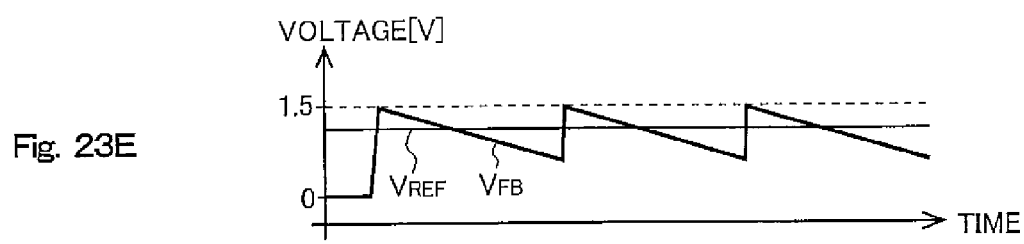
Figure 24A:
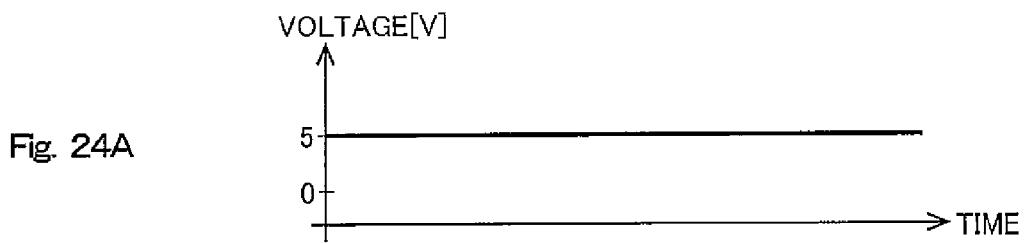
FIGS. 24A to 24E are diagrams showing voltage waveforms at individual portions of the ion generating device shown in FIG. 22 in the case where capacitance of the discharging portion in the ion generating element increases.
Figure 24B:
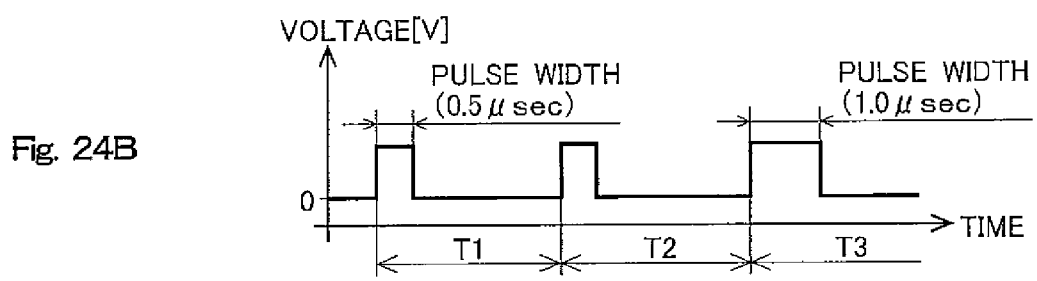
Figure 24C:
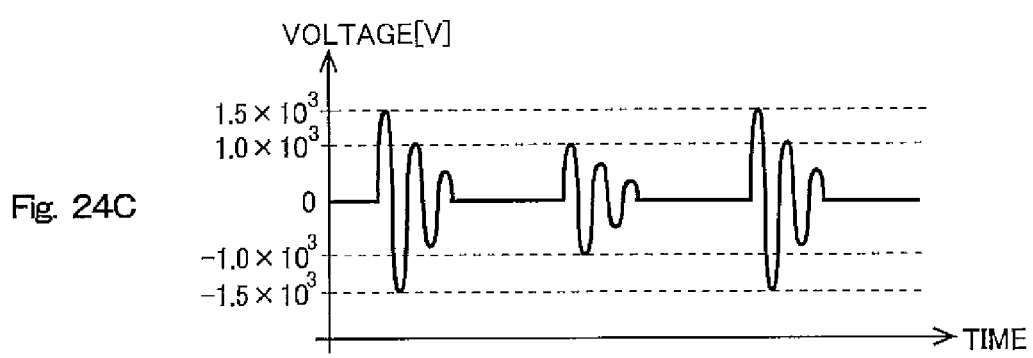
Figure 24D:
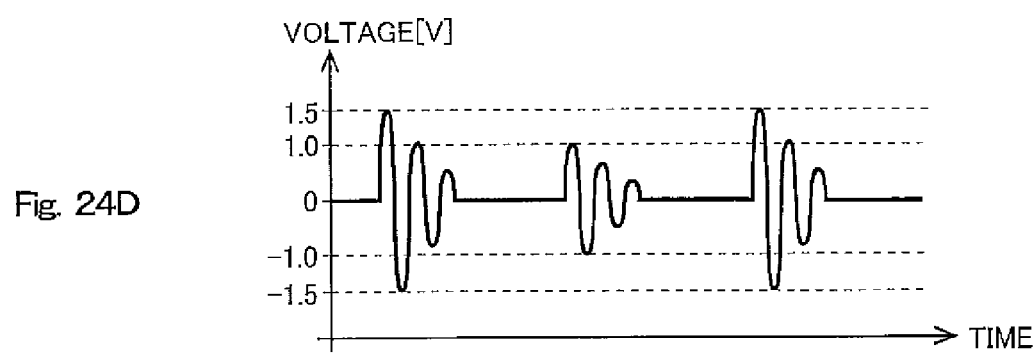
Figure 24E:
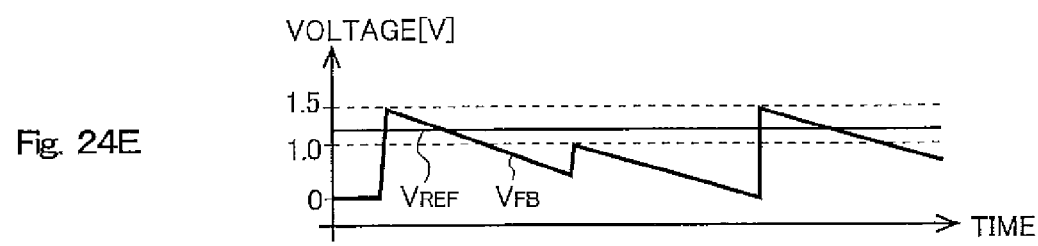

The ion generating device shown in FIG. 22 is different from the ion generating device shown in FIG. 18 in that the former generates the feedback voltage $V_{FB}$ based on the voltage generated by output current I1 flowing in the resistor R14, but another operations for the high voltage output and maintaining the output voltage by the feedback circuit are the same as the ion generating device shown in FIG. 18. For example, using the feedback voltage $V_{FB}$ at the +1.5 volts generated based on the voltage generated when the output current I1 that is 15 mA flows in the resistor R14, a resistance value of the resistor R14 is set to 100 ohms, a capacitance value of the capacitor C1 is set to 0.01 microfarads, and a resistance value of the resistor R13 is set to 1 megohm for setting circuit element constants as an example.

FIGS. 23A to 23E show voltage waveforms at individual portions of the ion generating device shown in FIG. 22. FIGS. 24A to 24F show voltage waveforms at individual portions of the ion generating device shown in FIG. 22, indicating the state in which the feedback circuit (including the resistor R14, the peak hold circuit 38, the reference voltage circuit 24C, and the voltage comparing portion 24D) works for maintaining the output voltage of the high voltage generating circuit 400 when the output voltage of the high voltage generating circuit 400 decreases in accordance with an influence of increase of capacitance in the discharging portion of the ion generating element 21. The voltage waveforms shown in FIGS. 23A to 23E are similar to voltage waveforms shown in FIGS. 20A to 20E, and voltage waveforms shown in FIGS. 24A to 24E are similar to voltage waveforms shown in FIGS. 21A to 21E. Therefore, detailed description thereof will be omitted here.

Figure 28C:
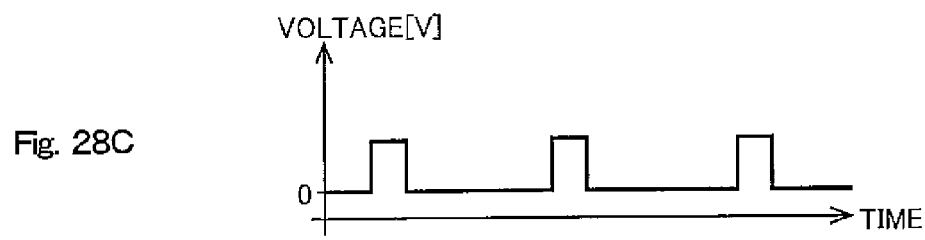
Figure 28D:
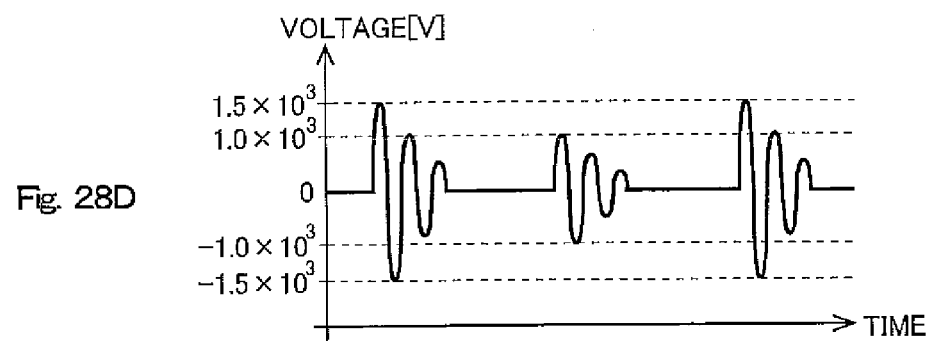
Figure 28E:
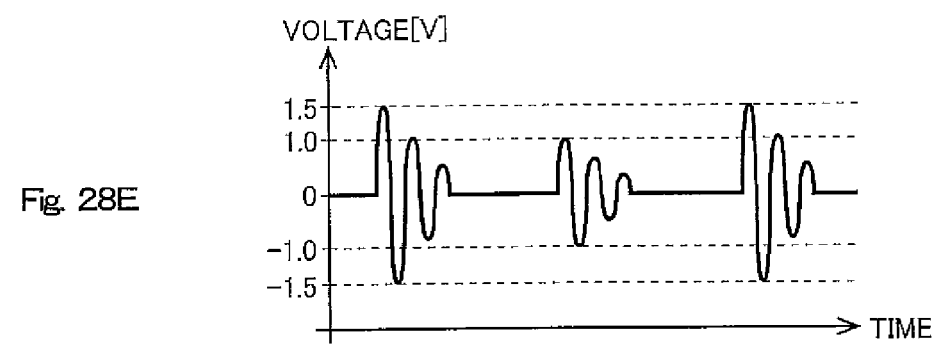
Figure 28F:
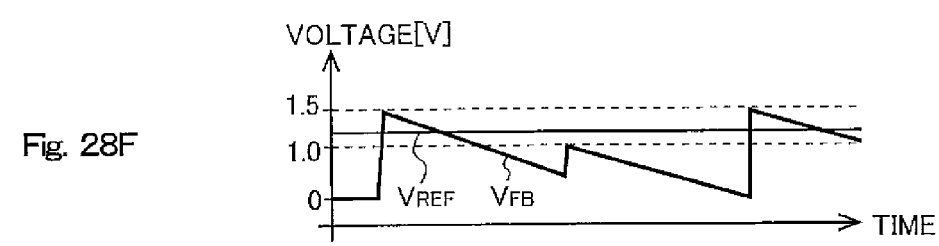

Next, still another embodiment of the ion generating device that can achieve the fifth object described above is shown in FIG. 25. Note that the same parts shown in FIG. 25 as those shown in FIG. 18 are denoted by the same references, so that power supply 26, i.e., a waveform of the input voltage of the trigger coil 22. FIG. 28C shows a waveform of the pulse signal delivered from the processing unit 24" to the bipolar transistor TR1, i.e., a waveform of the base signal of the bipolar transistor TR1. FIG. 28D shows a waveform of the output voltage of the trigger coil 22. FIG. 28E shows a waveform of the voltage supplied from the voltage divider circuit 37 to the peak hold circuit 38. FIG. 28F shows a waveform of the feedback voltage $V_{FB}$ delivered from the peak hold circuit 38 and a waveform of the reference voltage $V_{REF}$ delivered from the reference voltage circuit 24C of the processing unit 24".

The pulse signal generating portion 24E for the booster switching regulator sets the number of pulses during the next predetermined time in accordance with the output voltage level of the voltage comparing portion 24D at each predetermined time. In a first predetermined time PT1, there is a period in which the output voltage of the voltage comparing portion 24D has a high level (see FIG. 28F), so the pulse signal generating portion 24E for the booster switching regulator sets the number of pulses at the second predetermined time PT2 to three (a standard value). At the second predetermined time PT2, the output voltage of the high voltage generating circuit 500 drops because of an influence of the increased capacitance of the discharging portion of the ion generating element (see FIG. 28D). As a result, the feedback voltage $V_{FB}$ is always below the reference voltage $V_{REF}$ so that there is no period in which the output voltage of the voltage comparing portion 24D has a high level (see FIG. 28F). Therefore, the pulse signal generating portion 24E for the booster switching regulator sets the number of pulses at a third predetermined time PT3 to six (see FIG. 28A). Note that the number of pulses 3 and 6 are examples.

Next, still another embodiment of the ion generating device that can achieve the fifth object described above is shown in FIG. 29. Note that the same parts shown in FIG. 29 as those shown in FIG. 18 are denoted by the same references, so that detailed description thereof will be omitted.

Figure 29:
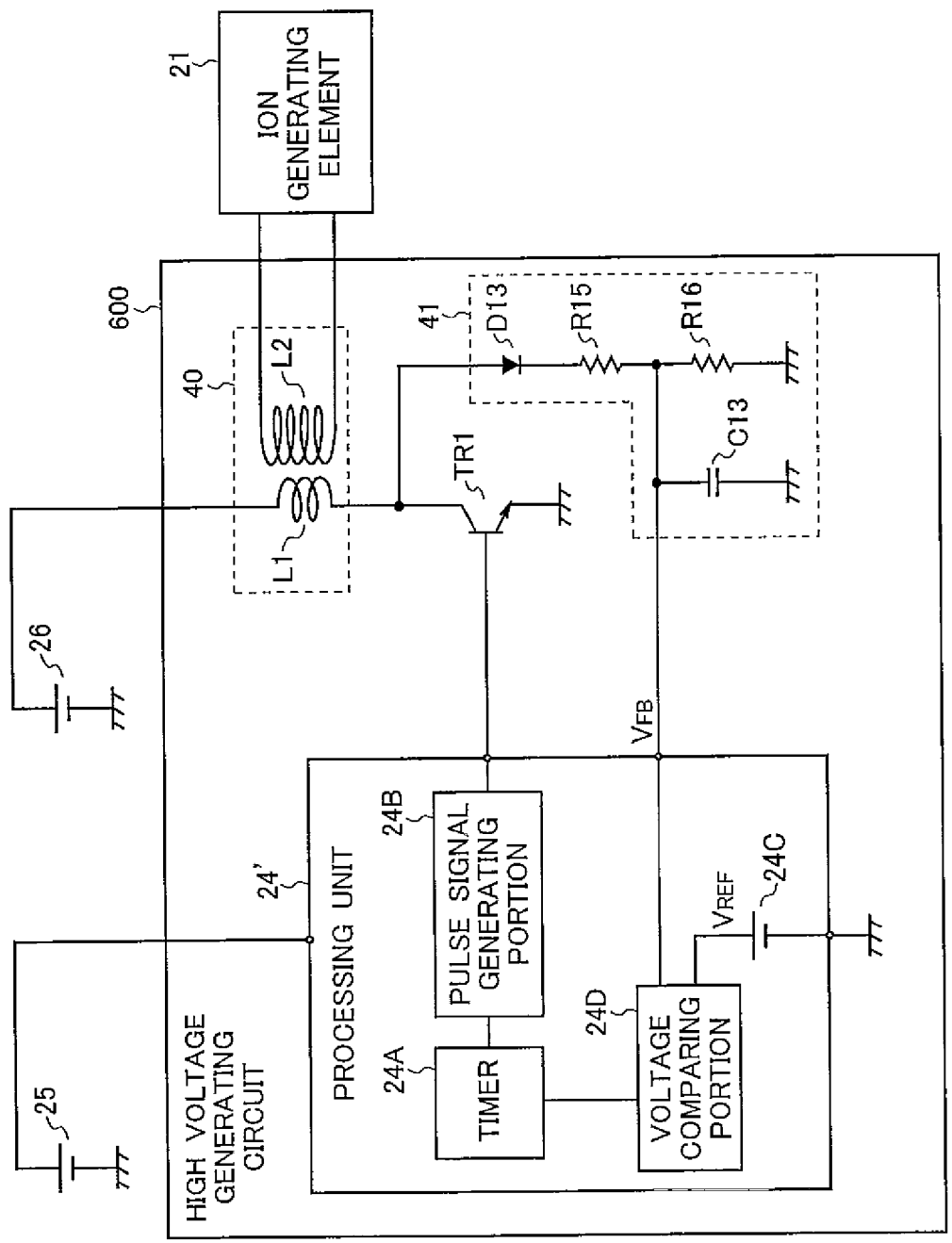
FIG. 29 is a circuit diagram showing still another embodiment of the ion generating device according to the present invention equipped with the high voltage generating circuit that can maintain the output voltage to be a constant value.

The ion generating device shown in FIG. 29 adopts a method of feeding back a voltage value at the primary side of the boosting portion that generates the high voltage as an output voltage of the high voltage generating circuit, so that the output voltage of the high voltage generating circuit is maintained at a constant value.

The ion generating device shown in FIG. 29 includes the ion generating element 21 having the discharging portion and a high voltage generating circuit 600 for applying high voltage to the discharging portion. The high voltage generating circuit 600 includes a trigger coil 40 that is the boosting portion for boosting the DC voltage delivered from the DC power supply 26 so as to deliver the high voltage to the discharging portion connected to the secondary side, the bipolar transistor TR1 that is the switching element for turning on and off current flowing at the primary side of the trigger coil 40, the processing unit 24' having the pulse signal generating portion 24B for generating a pulse signal for controlling on and off of the bipolar transistor TR1, the timer 24A for adjusting the pulse width and the pulse interval of the pulse signal, the reference voltage circuit 24C for delivering the reference voltage $V_{REF}$, and the voltage comparing portion 24D for comparing the feedback voltage $V_{FB}$ with the reference voltage $V_{REF}$, and a peak hold circuit 41 having a diode D13 for rectifying the node voltage at the primary side of the trigger coil 40 and the bipolar transistor TR1, resistors R15 and R16 for dividing the voltage rectified by the diode D13, and a capacitor C13 for smoothing the voltage divided by the resistors TR15 and R16 so as to generate the feedback voltage $V_{FB}$. As an example of the processing unit 24', there is a microcomputer for controlling by software the generation of the pulse signal, the adjustment of the pulse width and the pulse interval of the pulse signal, and the voltage comparison between the feedback voltage $V_{FB}$ and the reference voltage $V_{REF}$, or a customer specific LSI for controlling by hardware the generation of the pulse signal, the adjustment of the pulse width and the pulse interval of the pulse signal, and the voltage comparison between the feedback voltage $V_{FB}$ and the reference voltage $V_{REF}$.

The positive electrode of the DC power supply 25 is connected to the power source terminal of the processing unit 24'. The positive electrode of the DC power supply 26 is connected to an end of the primary winding L1 of the trigger coil 40. The negative electrode of the DC power supply 25, the negative electrode of the DC power supply 26, and the GND terminal of the processing unit 24' are connected to the ground. The other end of the primary winding L1 of the trigger coil 40 is connected to the collector terminal of the bipolar transistor TR1. The emitter terminal of the bipolar transistor TR1 is connected to the ground. The base terminal of the bipolar transistor TR1 is connected to the pulse signal output terminal of the processing unit 24'. Both ends of the secondary winding L2 of the trigger coil 40 are connected to the discharge electrode and the induction electrode of the discharging portion of the ion generating element 21. The collector terminal of the bipolar transistor TR1 is connected to the anode terminal of the diode D13. The cathode terminal of the diode D13 is connected to an end of the resistor R15. The other end of the resistor R15 is connected to an end of the resistor R16, an end of the capacitor C13 and the feedback terminal of the processing unit 24'. The other end of the resistor R16 and the other end of the capacitor C13 are connected to the ground. For example, in case of setting the feedback voltage $V_{FB}$ to +1.5 volts when the high voltage generating circuit 600 supplies the AC impulse high voltage having a peak to peak potential difference of 3 kilovolts to the ion generating element 21, an inductance value of the primary winding L1 of the trigger coil 40 is set to 0.256 µH, an inductance value of the secondary winding L2 of the trigger coil 40 is set to 23 mH, a resistance value of the resistor R15 is set to 33 kilohms, a resistance value of the resistor R16 is set to 180 kilohms, and a capacitance value of the capacitor C13 is set to 4.7 nF for setting circuit element constants as an example.

Next, an operation of the ion generating device shown in FIG. 29 will be described. As for the ion generating device shown in FIG. 29, when the pulse signal delivered from the processing unit 24' turns on the bipolar transistor TR1 so that current flows in the primary winding L1 of the trigger coil 40, the mutual induction causes generation of the high voltage determined by the turns ratio at the secondary winding L2 of the trigger coil 40, and the high voltage is applied between the discharge electrode and the induction electrode of the ion generating element 21. At the same time, the collector voltage of the bipolar transistor TR1 is rectified by the diode D13 and then divided by the resistor R15 and the resistor R16. The divided voltage is smoothed by the capacitor C13 and is converted into the feedback voltage $V_{FB}$. The feedback voltage $V_{FB}$ delivered from the peak hold circuit 41 is supplied to the feedback input terminal of the processing unit 24'. Then, the voltage comparing portion 24D in the processing unit 24' compares the feedback voltage $V_{FB}$ with the reference voltage $V_{REF}$. If the feedback voltage $V_{FB}$ is always below the reference voltage $V_{REF}$ during a predetermined period, i.e., if the output voltage of the high voltage generating circuit 600 drops, the timer 24A changes setting so that only the pulse width is increased without changing the pulse interval of the pulse signal delivered from the processing unit 24'. Thus, if the output voltage of the high voltage generating circuit 600 drops, the pulse width of the pulse signal delivered from the processing unit 24' increases so that the output voltage of the high voltage generating circuit 600 increases. Therefore, the output voltage of the high voltage generating circuit 600 can be maintained at a constant value.

After that, until the next pulse signal is delivered at an interval controlled by the timer 24A of the processing unit 24', the bipolar transistor TR1 is turned off, so the high voltage is not applied to the discharge electrode of the discharging portion of the ion generating element 21. The operation for generating the high voltage is repeated in accordance with the pulse signal delivered at the interval controlled by the timer 24A of the processing unit 24'.

Figures 30A, 30B, 30C:
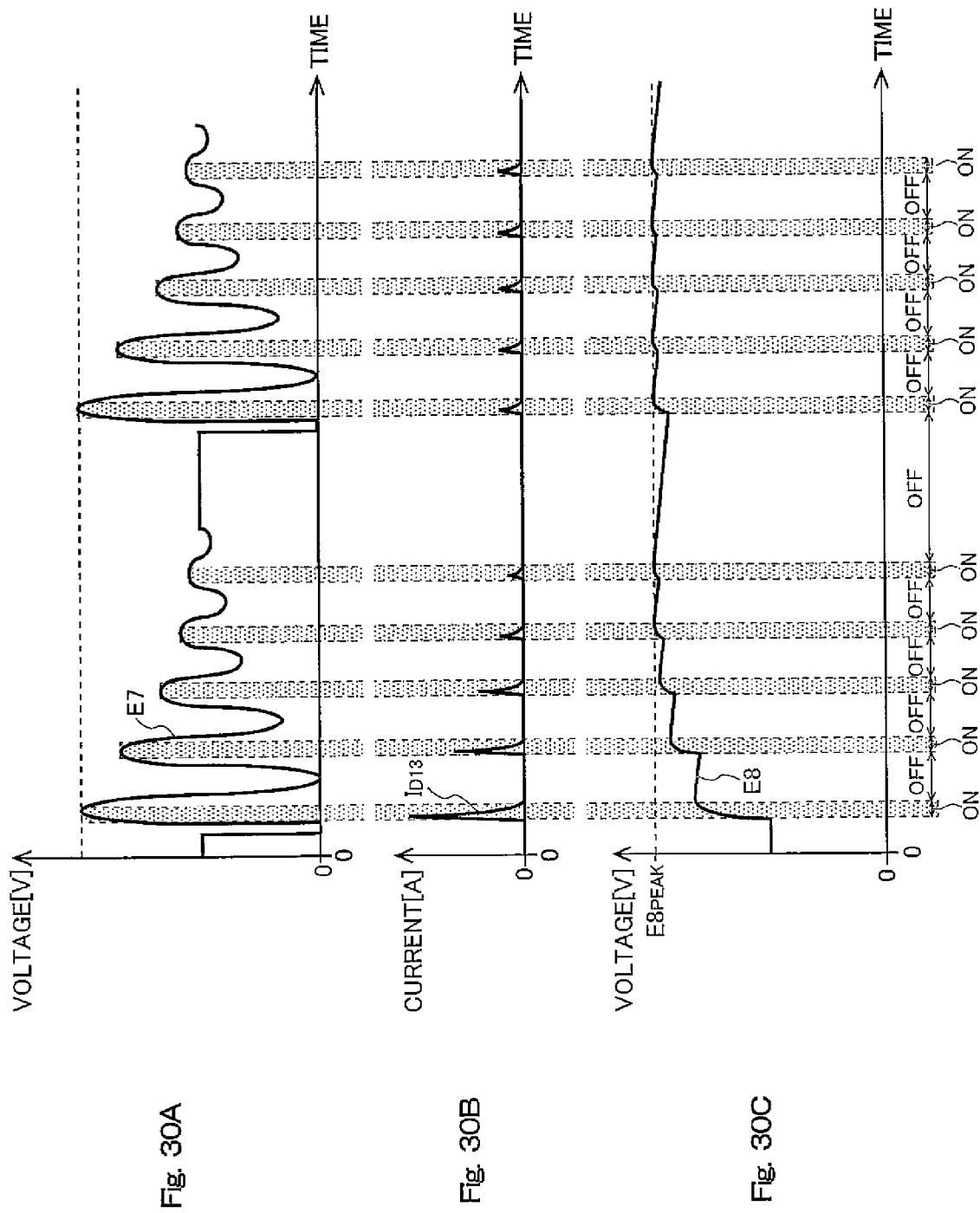
FIGS. 30A to 30C are diagrams showing voltage and current waveforms at individual portions of the peak hold circuit provided to the ion generating device shown in FIG. 29.

An operation of the peak hold circuit 41 will be described with reference to FIGS. 30A to 30C. FIGS. 30A to 30C are diagrams showing voltage and current waveforms at individual portions of the peak hold circuit 41. The voltage E7 shown in FIG. 30A is an input voltage of the peak hold circuit 41. The current ID13 shown in FIG. 30B is current flowing in the diode D13, and the voltage E8 shown in FIG. 30C is an output voltage of the peak hold circuit 41. When the input voltage E7 of the peak hold circuit 41 exceeds the output voltage E8 of the peak hold circuit 41 by a forward voltage VF of the diode D13, the current flows in the diode D13. In other words, the diode D13 is turned on when the input voltage E7 of the peak hold circuit 41 exceeds the output voltage E8 of the peak hold circuit 41 by a forward voltage VF of the diode D13. Since the capacitor C13 is charged, the period in which the diode D13 is turned on becomes short. The period in which the diode D13 is turned on is the period for charging the capacitor C13, and the period in which the diode D13 is turned off is the period for discharging the capacitor C13. As a result, the input voltage E7 of the peak hold circuit 41 becomes a DC signal having a ripple like the output voltage E8 of the peak hold circuit41. The time that is necessary for the output voltage E8 of the peak hold circuit 41 to reach the peak voltage E8PEAK depends on a capacitance value of the capacitor C13. Note that "E8PEAK={R15/(R15+R16)}× (E7PEAK−VF)" holds. However, "R15" represents a resistance value of the resistor R15, "R16" represents a resistance value of the resistor R16, and "E7PEAK" represents a peak voltage of the input voltage E7 of the peak hold circuit41.

Figure 31A:
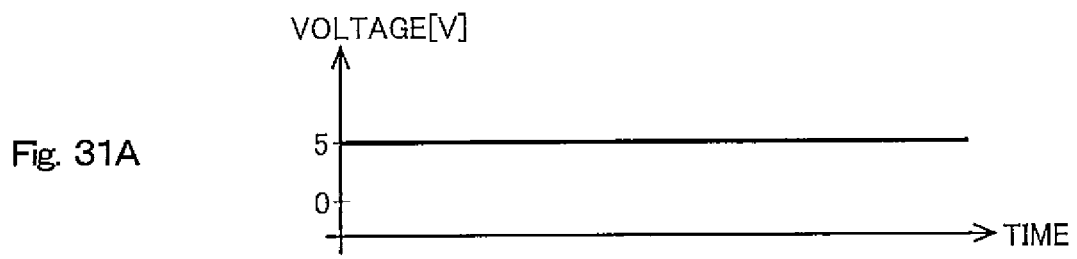
FIGS. 31A to 31E are diagrams showing voltage waveforms at individual portions of the ion generating device shown in FIG. 29.
Figure 31B:
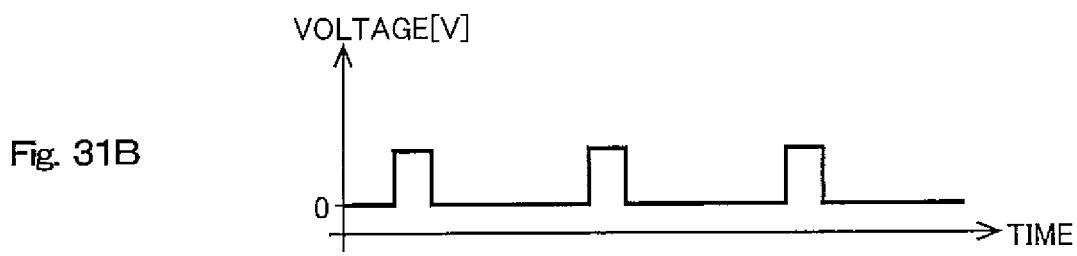
Figure 31C:
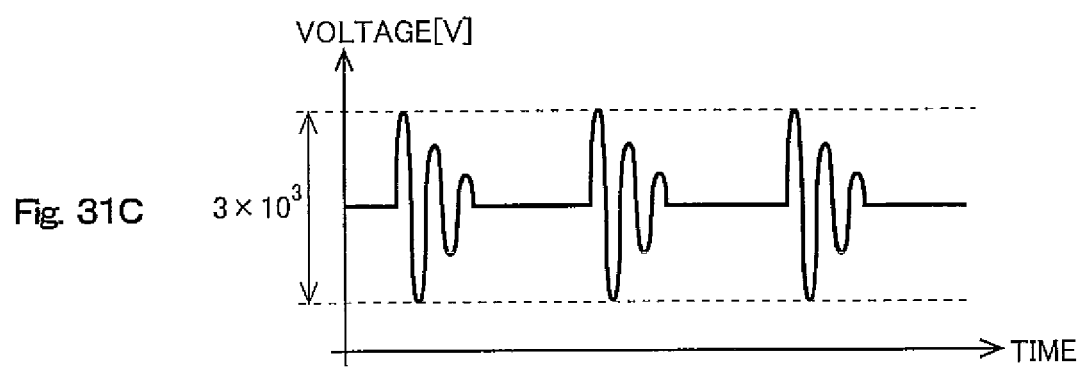
Figure 31D:
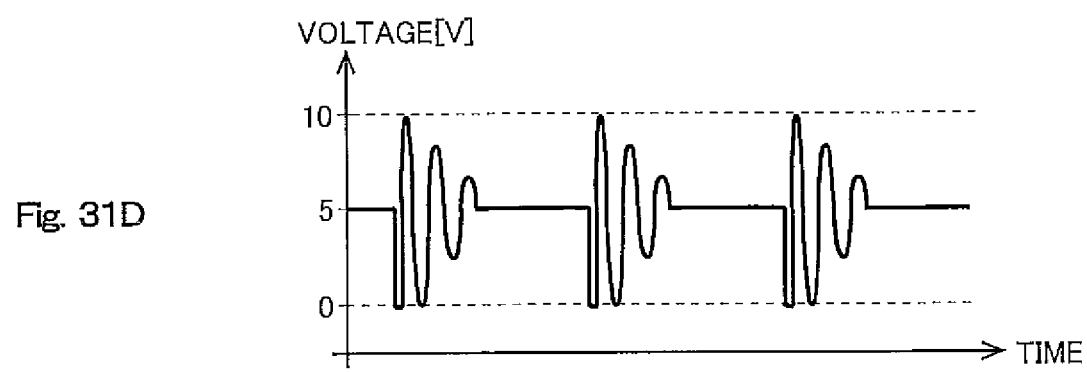
Figure 31E:
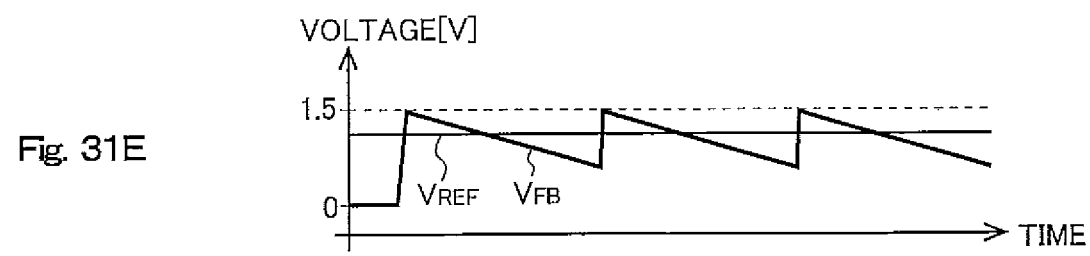

Voltages at individual portions of the ion generating device shown in FIG. 29 have waveforms shown in FIGS. 31A to 31E. Here, FIG. 31A shows a waveform of the voltage that is applied to the trigger coil 40 from the DC power supply 26, i.e., a waveform of the input voltage of the trigger coil 40, FIG. 31B shows a waveform of the pulse signal delivered from the processing unit 24', i.e., a waveform of the base signal of the bipolar transistor TR1, FIG. 31C shows a waveform of the output potential difference on the secondary side of the trigger coil 40, FIG. 31D shows a waveform of the collector signal of the bipolar transistor TR1, and FIG. 31E shows a waveform of the feedback voltage $V_{FB}$ delivered from the peak hold circuit 41 and a waveform of the reference voltage $V_{REF}$ delivered from the reference voltage circuit 24C in the processing unit 24'.

Figure 32A:
FIGS. 32A to 32E are diagrams showing voltage waveforms at individual portions of the ion generating device shown in FIG. 29 in the case where capacitance of the discharging portion in the ion generating element increases.
Figure 32B:
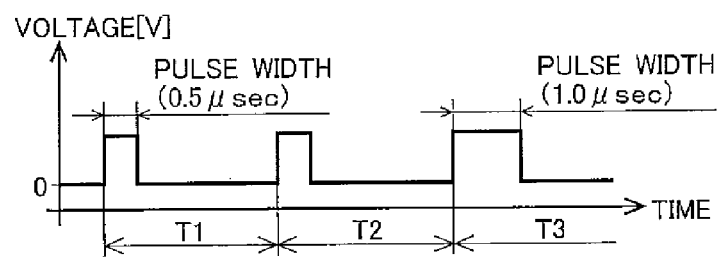
Figure 32C:
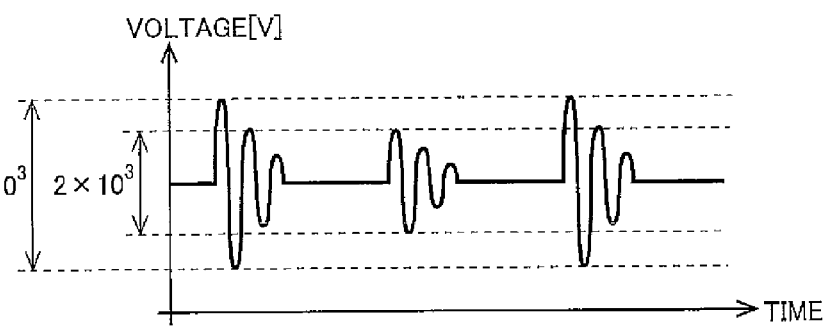
Figure 32D:
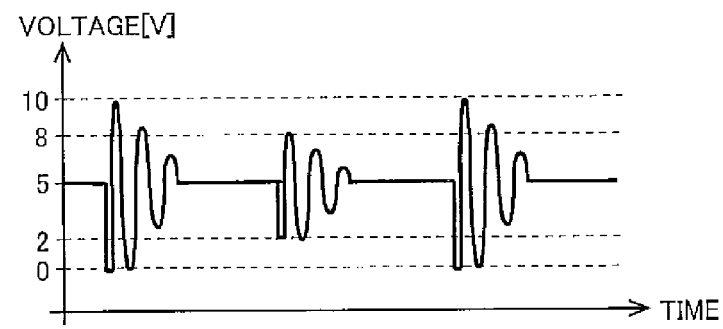
Figure 32E:
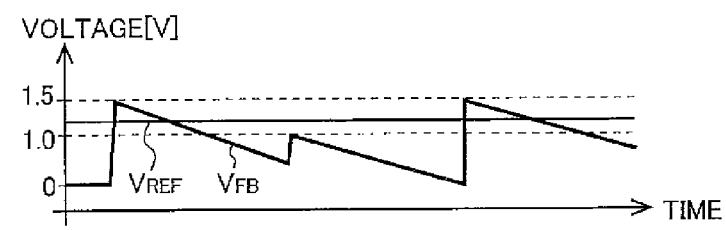

FIGS. 32A to 32E show voltage waveforms at individual portions of the ion generating device shown in FIG. 29, indicating the state in which the feedback circuit (including the peak hold circuit 41, the reference voltage circuit 24C, and the voltage comparing portion 24D) works for maintaining the output voltage of the high voltage generating circuit 600 when the output voltage of the high voltage generating circuit 600 drops in accordance with an influence of increase of capacitance in the discharging portion of the ion generating element 21. FIG. 32A shows a waveform of the voltage that is applied to the trigger coil 40 from the DC power supply 26, i.e., a waveform of the input voltage of the trigger coil 40, FIG. 32B shows a waveform of the pulse signal delivered from the processing unit 24', i.e., a waveform of the base signal of the bipolar transistor TR1, FIG. 32C shows a waveform of the output potential difference on the secondary side of the trigger coil 40, FIG. 32D shows a waveform of the collector signal of the bipolar transistor TR1, and FIG. 32E shows a waveform of the feedback voltage $V_{FB}$ delivered from the peak hold circuit 41 and a waveform of the reference voltage $V_{REF}$ delivered from the reference voltage circuit 24C in the processing unit 24'.

The timer 24A sets the pulse width at the next pulse interval in accordance with an output voltage level of the voltage comparing portion 24D at each pulse interval. In the first pulse interval T1, there is a period in which the output voltage of the voltage comparing portion 24D has a high level (see FIG. 32E), so the timer 24A sets the pulse width at the second pulse interval T2 to 0.5 μsec (a standard value). In the second pulse interval T2, increase of capacitance in the discharging portion of the ion generating element causes a drop of the output potential difference of the high voltage generating circuit 600 (see FIG. 32C), so that the feedback voltage $V_{FB}$ is always below the reference voltage $V_{REF}$, and that there is no period in which the output voltage of the voltage comparing portion 24D has a high level (see FIG. 32E). Therefore, the timer 24A sets the pulse width at the third pulse interval T3 to 1.0 μsec (see FIG. 32B). Note that the pulse width values 0.5 μsec and 1.0 μsec are examples.

Note that it is possible to adopt the structure for increasing the DC voltage supplied to the boosting portion so that the high voltage delivered from the secondary side of the boosting portion can be maintained at a constant value as to the ion generating device adopting the method of feeding back the voltage on the primary side of the boosting portion that generates the high voltage as the output voltage of the high voltage generating circuit so that the output voltage of the high voltage generating circuit can be maintained at a constant value. For example, it is possible to maintain the high voltage delivered from the secondary side of the boosting portion when the DC voltage supplied to the boosting portion is raised by adding the same modification to the ion generating device shown in FIG. 29 as the modification from FIG. 18 to FIG. 25.

In addition, as to the ion generating device shown in FIG. 18, 22 or 29, it is possible to increase further the pulse width of the pulse signal delivered from processing unit 24' if the feedback voltage $V_{FB}$ is always below the reference voltage $V_{REF}$ during a predetermined period, i.e., if the output voltage of the high voltage generating circuit drops after the pulse width of the pulse signal delivered from the processing unit 24' is increased. In this case, it is desirable to set an upper limit to the pulse width of the pulse signal delivered from the processing unit 24' and to provide in the processing unit 24' an error output portion that produces an error output when the pulse width of the pulse signal delivered from the processing unit 24' reaches the upper limit. Thus, since a user can recognize from the error output that a capacitance value of the discharging portion has increased, it is possible to maintain the discharging portion. As setting of the pulse width, for example, the standard value is set to 0.5 μsec, the pulse width is increased every 0.5 μsec, and the upper limit is set to 2.0 μsec.

In addition, as to the ion generating device shown in FIG. 25, it is possible to increase further the number of pulses per a predetermined time of the control signal for controlling the switching transistor of the booster switching regulator 39 if the feedback voltage $V_{FB}$ is always below the reference voltage $V_{REF}$ during a predetermined period, i.e., if the output voltage of the high voltage generating circuit drops after the number of pulses per a predetermined time of the control signal for controlling the switching transistor of the booster switching regulator 39 is increased. In this case, it is desirable to set an upper limit to the number of pulses per a predetermined time of the control signal for controlling the switching transistor of the booster switching regulator 39 and to provide in the processing unit 24" an error output portion that produces an error output when the number of pulses per a predetermined time of the control signal for controlling the switching transistor of the booster switching regulator 39 reaches the upper limit. Thus, since the user can recognize from the error output that a capacitance value of the discharging portion has increased, it is possible to maintain the discharging portion. As the number of pulses per a predetermined time, for example, the standard value is set to three so that the increase is performed every three pulses, and the upper limit is set to twelve.

In addition, as to the ion generating device shown in FIGS. 18, 22, 25 and 29, it is possible to adopt the structure in which a switch is provided between the voltage comparing portion 24D and the power source terminal of the processing unit, and the switch is turned on and off so that the voltage comparing portion works when the power is turned on or only at a constant interval of time. Thus, power consumption in the voltage comparing portion 24D can be controlled.

In addition, the embodiments described above can be combined as necessity.

Figure 33:
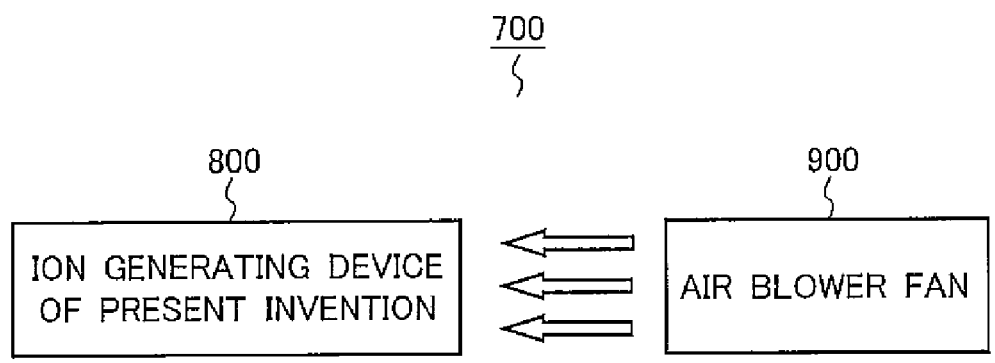
FIG. 33 is a diagram showing a general structural example of an electrical apparatus according to the present invention.

The ion generating device according to the present invention is preferably incorporated in an electrical apparatus such as an air conditioner, a dehumidifier, a humidifier, an air cleaner, a refrigerator, a fan heater, a microwave oven, a washing machine with a dryer, a cleaner and a pasteurizer. Furthermore, an electrical apparatus 700 is preferably equipped with a delivery portion (e.g., an air blower fan 900) for delivering into the air the ion generated by an ion generating device 800 according to the present invention as shown in FIG. 33. This electrical apparatus can perform, adding to its essential function, the function of suppressing activity and growth of molds and germs in the air by the action of the plus ions and minus ions delivered from the incorporated ion generating device, so that the room environment can be desirable ambient air conditions.

What is claimed is:

1. A high voltage generating circuit comprising:
   a boosting portion for boosting DC voltage delivered from a DC power supply, so as to deliver high voltage at a secondary side;
   a switching element for turning on and off primary current of the boosting portion; and
   a pulse signal generating portion for generating a pulse signal for controlling on and off of the switching element,
   wherein the boosting portion delivers one AC impulse high voltage corresponding to one pulse of the pulse signal delivered from the pulse signal generating portion.

2. The high voltage generating circuit according to claim 1, wherein the pulse signal delivered from the pulse signal generating portion has a variable pulse width.

3. The high voltage generating circuit according to claim 1, wherein the pulse signal delivered from the pulse signal generating portion has a variable pulse interval.

4. The high voltage generating circuit according to claim 1, wherein the boosting portion is a transformer.

5. The high voltage generating circuit according to claim 1, wherein the boosting portion is a trigger coil.

6. The high voltage generating circuit according to claim 1, wherein the switching element is a MOSFET.

7. The high voltage generating circuit according to claim 1, wherein the switching element is a bipolar transistor.

8. The high voltage generating circuit according to claim 1, wherein the pulse signal generating portion is a microcomputer for controlling generation of the pulse signal by software.

9. The high voltage generating circuit according to claim 1, wherein the pulse signal generating portion is a customer specific LSI for controlling generation of the pulse signal by hardware.

10. The high voltage generating circuit according to claim 1, wherein a value of the high voltage delivered from a secondary side of the boosting portion changes in accordance with a value of the DC voltage delivered from the DC power supply.

11. An ion generating device comprising:
    a high voltage generating circuit including a boosting portion for boosting DC voltage delivered from a DC power supply, so as to deliver high voltage at a secondary side, a switching element for turning on and off primary current of the boosting portion, and a pulse signal generating portion for generating a pulse signal for controlling on and off of the switching element; and
    a discharging portion for generating ions when the high voltage delivered from the high voltage generating circuit is applied to it,
    wherein the boosting portion delivers one AC impulse high voltage corresponding to one pulse of the pulse signal delivered from the pulse signal generating portion.

12. The ion generating device according to claim 11, wherein a pulse width of the pulse signal delivered from the pulse signal generating portion is adjusted so that a value of the high voltage delivered from the high voltage generating circuit can be adjusted.

13. The ion generating device according to claim 11, wherein a pulse interval of the pulse signal delivered from the pulse signal generating portion is adjusted so that generating quantity of ions can be controlled.

14. The ion generating device according to claim 11, wherein the high voltage generating circuit is provided with a first rectifying portion for rectifying the high voltage delivered from a secondary side of the boosting portion into positive voltage and a second rectifying portion for rectifying the high voltage delivered from the secondary side of the boosting portion into negative voltage, and the discharging portion includes a first discharging portion to which the positive voltage from the first rectifying portion is applied and a second discharging portion to which the negative voltage from the second rectifying portion is applied.

15. The ion generating device according to claim 14, wherein the first rectifying portion and the second rectifying portion are diodes.

16. The ion generating device according to claim 11, wherein the discharging portion generates both minus ions and plus ions.

17. The ion generating device according to claim 16, wherein the plus ions are $H^+(H_2O)m$ while the minus ions are $O_2^-(H_2O)_n$ (m and n are natural numbers).

18. An electrical apparatus comprising:
an ion generating device having
a high voltage generating circuit including a boosting portion for boosting DC voltage delivered from a DC power supply, so as to deliver high voltage at a secondary side, a switching element for turning on and off primary current of the boosting portion, and a pulse signal generating portion for generating a pulse signal for controlling on and off of the switching element; and
a discharging portion for generating ions when the high voltage delivered from the high voltage generating circuit is applied to it; and
a delivery portion for delivering ions generated by the ion generating device in the air,
wherein the boosting portion delivers one AC impulse high voltage corresponding to one pulse of the pulse signal delivered from the pulse signal generating portion.

19. The high voltage generating circuit according to claim 1, further comprising
a feedback voltage generating portion for generating feedback voltage that is DC voltage corresponding to a peak value of the high voltage delivered from the secondary side of the boosting portion, and
a voltage comparing portion for comparing the feedback voltage with a reference voltage, wherein
the high voltage delivered from the secondary side of the boosting portion is kept to be a constant value based on a result of the comparison performed by the voltage comparing portion.

20. The high voltage generating circuit according to claim 1, further comprising
a feedback voltage generating portion for generating feedback voltage that is DC voltage corresponding to a peak value of node voltage of a primary side of the boosting portion and the switching element, and
a voltage comparing portion for comparing the feedback voltage with a reference voltage, wherein
the high voltage delivered from the secondary side of the boosting portion is kept to be a constant value based on a result of the comparison performed by the voltage comparing portion.

21. The high voltage generating circuit according to claim 19, wherein if the feedback voltage is always lower than the reference voltage during a predetermined period, a pulse width of the pulse signal delivered from the pulse signal generating portion is increased so that the high voltage delivered from the secondary side of the boosting portion can be maintained to be a constant value.

22. The high voltage generating circuit according to claim 19, wherein if the feedback voltage is always lower than the reference voltage during a predetermined period, a DC voltage delivered from the DC power supply is increased so that the high voltage delivered from the secondary side of the boosting portion can be maintained to be a constant value.

23. The high voltage generating circuit according to claim 22, further comprising a chopper type booster switching regulator, and the output voltage of the booster switching regulator is the DC voltage delivered from the DC power supply.

24. The high voltage generating circuit according to claim 23, wherein if the feedback voltage is always lower than the reference voltage during a predetermined period, the number of switching times of the booster switching regulator per a predetermined time is increased so that the high voltage delivered from the secondary side of the boosting portion can be maintained to be a constant value.

25. A high voltage generating circuit comprising:
a boosting portion for boosting DC voltage delivered from a DC power supply, so as to deliver high voltage at a secondary side;
a switching element for turning on and off primary current of the boosting portion;
a pulse signal generating portion for generating a pulse signal for controlling on and off of the switching element;
a feedback voltage generating portion for generating a feedback voltage that is a DC voltage corresponding to a peak value of the high voltage delivered from the secondary side of the boosting portion; and
a voltage comparing portion for comparing the feedback voltage with a reference voltage, wherein
the high voltage delivered from the secondary side of the boosting portion is kept to be a constant value based on a result of the comparison performed by the voltage comparing portion,
if the feedback voltage is always lower than the reference voltage during a predetermined period, a pulse width of the pulse signal delivered from the pulse signal generating portion is increased so that the high voltage delivered from the secondary side of the boosting portion can be maintained to be a constant value, and
an upper limit is set to the pulse width of the pulse signal delivered from the pulse signal generating portion, and the high voltage generating circuit further includes an error output portion that produces an error output when the pulse width of the pulse signal delivered from the pulse signal generating portion reaches the upper limit.

26. A high voltage generating circuit comprising:
a boosting portion for boosting DC voltage delivered from a DC power supply, so as to deliver high voltage at a secondary side;
a switching element for turning on and off primary current of the boosting portion;
a pulse signal generating portion for generating a pulse signal for controlling on and off of the switching element;
a feedback voltage generating portion for generating a feedback voltage that is a DC voltage corresponding to a peak value of the high voltage delivered from the secondary side of the boosting portion;
a voltage comparing portion for comparing the feedback voltage with a reference voltage; and
a chopper type booster switching regulator, and the output voltage of the booster switching regulator is the DC voltage delivered from the DC power supply, wherein
the high voltage delivered from the secondary side of the boosting portion is kept to be a constant value based on a result of the comparison performed by the voltage comparing portion,
if the feedback voltage is always lower than the reference voltage during a predetermined period, a DC voltage delivered from the DC power supply is increased so that the high voltage delivered from the secondary side of the boosting portion can be maintained to be a constant value,
if the feedback voltage is always lower than the reference voltage during a predetermined period, the number of switching times of the booster switching regulator per a predetermined time is increased so that the high voltage delivered from the secondary side of the boosting portion can be maintained to be a constant value, and an upper limit is set to the number of switching times of the booster switching regulator per a predetermined time, and the high voltage generating circuit further includes an error output portion that produces an error output when the number of switching times of the booster switching regulator per a predetermined time reaches the upper limit.

27. The high voltage generating circuit according to claim 20, wherein the secondary side of the boosting portion is floating.

28. The high voltage generating circuit according to claim 19, wherein the voltage comparing portion operates when power is turned on or only at a constant interval of time.

29. The ion generating device according to claim 11, wherein the high voltage generating circuit includes a feedback voltage generating portion for generating feedback voltage that is DC voltage corresponding to a peak value of the high voltage delivered from the secondary side of the boosting portion, and a voltage comparing portion for comparing the feedback voltage with a reference voltage, wherein
 the high voltage delivered from the secondary side of the boosting portion is kept to be a constant value based on a result of the comparison performed by the voltage comparing portion.

30. The electrical apparatus according to claim 18, wherein the high voltage generating circuit includes a feedback voltage generating portion for generating feedback voltage that is DC voltage corresponding to a peak value of the high voltage delivered from the secondary side of the boosting portion, and a voltage comparing portion for comparing the feedback voltage with a reference voltage, wherein
 the high voltage delivered from the secondary side of the boosting portion is kept to be a constant value based on a result of the comparison performed by the voltage comparing portion.

* * * * *